(12) United States Patent
Yonemura et al.

(10) Patent No.: US 11,133,454 B2
(45) Date of Patent: Sep. 28, 2021

(54) PIEZOELECTRIC ELEMENT, LIQUID DISCHARGE HEAD, AND PRINTER

(71) Applicant: SEIKO EPSON CORPORATION, Tokyo (JP)

(72) Inventors: Takayuki Yonemura, Suwa (JP); Hidemichi Furihata, Chino (JP); Yasuto Kakemura, Kai (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/796,390

(22) Filed: Feb. 20, 2020

(65) Prior Publication Data

US 2020/0274054 A1 Aug. 27, 2020

(30) Foreign Application Priority Data

Feb. 26, 2019 (JP) .............................. JP2019-032593

(51) Int. Cl.
| | |
|---|---|
| *B41J 2/14* | (2006.01) |
| *H01L 41/083* | (2006.01) |
| *H01L 41/187* | (2006.01) |
| *H01L 41/09* | (2006.01) |

(52) U.S. Cl.
CPC ...... *H01L 41/0838* (2013.01); *B41J 2/14233* (2013.01); *H01L 41/0973* (2013.01); *H01L 41/1873* (2013.01)

(58) Field of Classification Search
None
See application file for complete search history.

(56) References Cited

U.S. PATENT DOCUMENTS

| | | | | |
|---|---|---|---|---|
| 2015/0207057 A1* | 7/2015 | Sakuma | ................. | G11B 21/24 360/294.4 |
| 2015/0280103 A1* | 10/2015 | Kobayashi | ............. | B41J 2/1634 347/68 |
| 2015/0329431 A1* | 11/2015 | Deville | ................... | C04B 35/52 428/188 |

FOREIGN PATENT DOCUMENTS

| | | |
|---|---|---|
| JP | 2001-223404 A | 8/2001 |
| JP | 2012-018995 A | 1/2012 |

* cited by examiner

*Primary Examiner* — Erica S Lin
(74) *Attorney, Agent, or Firm* — Chip Law Group

(57) ABSTRACT

A piezoelectric element includes: a first electrode provided on a base; a second electrode; and a piezoelectric layer that is provided between the first electrode and the second electrode and that contains a complex oxide having a perovskite structure and including potassium, sodium, and niobium, where: a surface of the piezoelectric layer on a side of the second electrode is composed of faces of first grains and faces of second grains; a roughness height on the faces of the first grains is larger than a roughness height on the faces of the second grains; and an area occupied by the faces of the first grains is 10.0% or less on the surface of the piezoelectric layer.

9 Claims, 22 Drawing Sheets

FIG. 20

| | FIRST KNNM LAYER | SECOND KNNM LAYERS | CRACKING | AREA OCCUPIED BY FIRST GRAIN FACES |
|---|---|---|---|---|
| EXAMPLE 1 | 75 nm | 40 nm × 24 LAYERS | ABSENT | 5.3% |
| EXAMPLE 2 | 75 nm | 51 nm × 19 LAYERS | ABSENT | 9.5% |
| COMPARATIVE EXAMPLE 1 | 94 nm | 51 nm × 19 LAYERS | PRESENT | 17.1% |
| COMPARATIVE EXAMPLE 2 | 75 nm | 75 nm × 10 LAYERS | PRESENT | 49.1% |

PIEZOELECTRIC ELEMENT, LIQUID DISCHARGE HEAD, AND PRINTER

The present application is based on, and claims priority from JP Application Serial Number 2019-032593, filed Feb. 26, 2019, the disclosure of which is hereby incorporated by reference herein in its entirety.

BACKGROUND

1. Technical Field

The present disclosure relates to a piezoelectric element, a liquid discharge head, and a printer.

2. Related Art

A representative example of the liquid discharge head is, for example, an ink jet-mode recording head in which a diaphragm is deformed by a piezoelectric element to pressurize ink within pressure chambers, thereby discharging ink droplets from nozzle holes.

A piezoelectric element used for such an ink jet-mode recording head is formed, for example by sandwiching, between two electrodes, a piezoelectric material that exhibits an electromechanical conversion function, such as a piezoelectric layer formed from a crystallized dielectric material.

Excellent piezoelectric characteristics are required for piezoelectric materials used for such a piezoelectric layer. Representative examples of piezoelectric materials include lead zirconate titanate ($Pb(Zr,Ti)O_3$: PZT) as described in JP-A-2001-223404, for example, and lead zirconate titanate is used as a thin film.

However, since PZT contains lead, there is a need for lead-free piezoelectric materials in view of environmental concerns. As such a lead-free piezoelectric material, potassium sodium niobate (($K,Na)NbO_3$: KNN) has been investigated.

KNN is also desired to form a thin film. However, cracking occurred in some cases when a KNN layer was formed as a film. In particular, cracking tends to arise when a KNN layer as a film is formed by chemical solution deposition (CSD).

SUMMARY

An embodiment of a piezoelectric element according to the present disclosure includes: a first electrode provided on a base; a second electrode; and a piezoelectric layer that is provided between the first electrode and the second electrode and that contains a complex oxide having a perovskite structure and including potassium, sodium, and niobium, where: a surface of the piezoelectric layer on a side of the second electrode is composed of faces of first grains and faces of second grains; a roughness height on the faces of the first grains is larger than a roughness height on the faces of the second grains; and an area occupied by the faces of the first grains is 10.0% or less on the surface of the piezoelectric layer.

In the embodiment of the piezoelectric element, when a crystal structure of the piezoelectric layer is regarded as pseudo-cubic, the piezoelectric layer may have (100) preferred orientation.

Regarding plane directions, the crystal structure of a piezoelectric layer is treated herein as pseudo-cubic. This is for simplification of explanation since it is difficult to accurately identify the crystal structure of a thin-film piezoelectric layer. However, treating the crystal structure of a piezoelectric layer as pseudo-cubic in terms of plane directions by no means denies that the crystal structure of a piezoelectric layer is an $ABO_3$ structure with lower symmetry than pseudo-cubic, such as tetragonal, orthorhombic, monoclinic, and rhombohedral. For example, when the crystal structure of a piezoelectric layer is tetragonal, (100) orientation means both (001) orientation and (100) orientation.

In the embodiment of the piezoelectric element, when a crystal structure of the piezoelectric layer is regarded as pseudo-cubic, the first grains may be (111)-oriented; and the second grains may be (100)-oriented.

An embodiment of a piezoelectric element according to the present disclosure includes: a first electrode provided on a base; a second electrode; and a piezoelectric layer that is provided between the first electrode and the second electrode and that contains a complex oxide having a perovskite structure and including potassium, sodium, and niobium, where: when a crystal structure of the piezoelectric layer is regarded as pseudo-cubic, the piezoelectric layer includes (111)-oriented grains; and an area occupied by faces of the grains is 10.0% or less on a surface of the piezoelectric layer on a side of the second electrode.

In the embodiment of the piezoelectric element, a thickness of the piezoelectric layer may be 500 nm or more and 2 μm or less.

In the embodiment of the piezoelectric element, the piezoelectric layer may be formed by stacking a first layer and a plurality of second layers; the first layer may be provided between the first electrode and the second layers; a ratio of potassium to sodium atom concentrations in the first layer may be different from a ratio of potassium to sodium atom concentrations in each of the second layers; and a thickness of each of the second layers may be 51 nm or less.

In the embodiment of the piezoelectric element, a thickness of the first layer may be 75 nm or less.

An embodiment of a liquid discharge head according to the present disclosure includes: the embodiment of the piezoelectric element; and a nozzle plate provided with a nozzle hole for discharging a liquid, where: the base includes a channel-formed substrate provided with a pressure chamber that changes a volume by the piezoelectric element and a supply channel for supplying the liquid to the pressure chamber; and the nozzle hole is connected with the pressure chamber.

An embodiment of a printer according to the present disclosure includes: the embodiment of the liquid discharge head; a transport mechanism for moving a recording medium relative to the liquid discharge head: and a control unit for controlling the liquid discharge head and the transport mechanism.

BRIEF DESCRIPTION OF THE DRAWINGS

FIG. 20 is a table showing an area occupied by first grain faces.

DESCRIPTION OF EXEMPLARY EMBODIMENTS

Hereinafter, preferable embodiments of the present disclosure will be described in detail by means of the drawings. However, the embodiments described hereinafter do not unreasonably limit the content of the present disclosure recited in the claims. Moreover, all the constitution described hereinafter is not necessarily the essential constitution required for the present disclosure.

1. Piezoelectric Element

Figure 1:
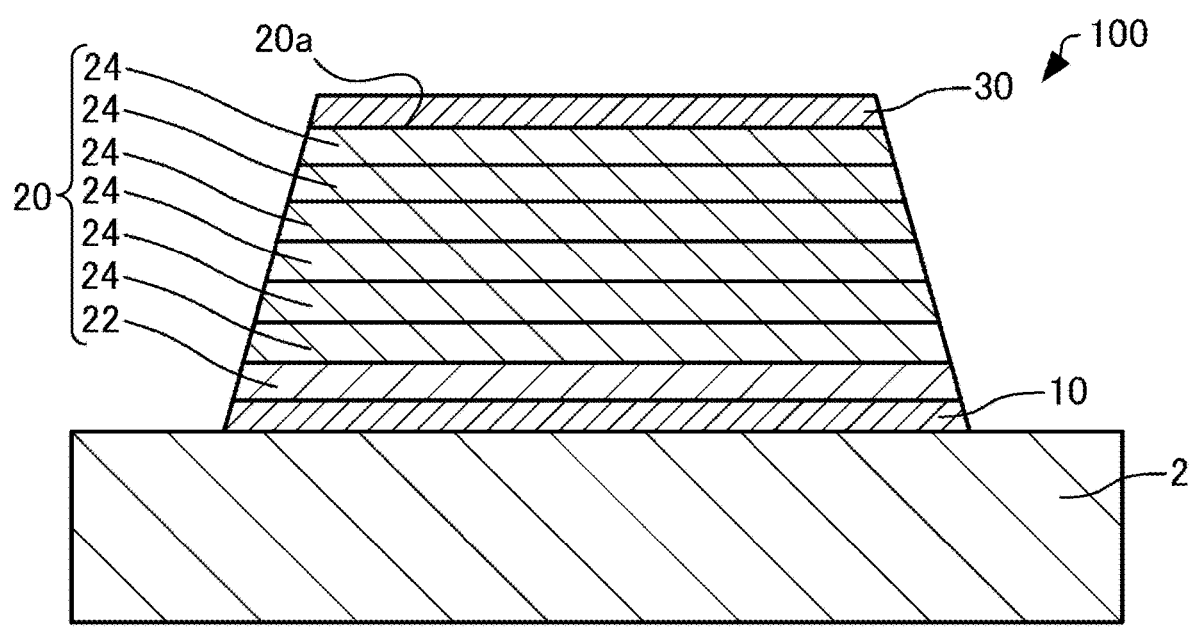
FIG. 1 is a cross-sectional view schematically illustrating a piezoelectric element according to an embodiment.

First, a piezoelectric element according to an embodiment will be described with reference to the drawings. FIG. 1 is a cross-sectional view schematically illustrating a piezoelectric element 100 according to an embodiment.

As illustrated in FIG. 1, the piezoelectric element 100 includes a first electrode 10, a piezoelectric layer 20, and a second electrode 30. The piezoelectric element 100 is provided on a base 2.

The base 2 is a plate formed of a semiconductor or an insulator, for example. The base 2 may be a single layer or a layered structure of a plurality of stacked layers. The inner structure of the base 2 is not limited provided that the upper surface has a planar shape and may be a structure in which a space or the like is formed inside.

The base 2 may be a diaphragm that exhibits flexibility and deforms by the action of the piezoelectric layer 20. The diaphragm is a silicon oxide layer, a zirconium oxide layer, or a layered structure of a zirconium oxide layer provided on a silicon oxide layer, for example.

In the illustrated example, the first electrode 10 is provided on the base 2. The form of the first electrode 10 is layered, for example. The thickness of the first electrode 10 is 3 nm or more and 200 nm or less, for example. The first electrode 10 is a metal layer, such as a platinum layer or an iridium layer; a conducting oxide layer thereof; or a strontium ruthenate ($SrRuO_3$: SRO) layer, for example. The first electrode 10 may have a structure in which a plurality of the above-mentioned exemplary layers are stacked.

The first electrode 10 is either of electrodes for applying voltage to the piezoelectric layer 20. The first electrode 10 is a lower electrode provided below the piezoelectric layer 20.

Although not shown, a bonding layer for enhancing adhesion between the first electrode 10 and the base 2 may be provided between the first electrode 10 and the base 2. The bonding layer is a titanium layer or a titanium oxide layer, for example. In this case, the first electrode 10 is provided on the base 2 via the bonding layer.

The piezoelectric layer 20 is provided on the first electrode 10. The piezoelectric layer 20 is provided between the first electrode 10 and the second electrode 30. The thickness of the piezoelectric layer 20 is 500 nm or more and 2 μm or less, for example, and preferably 1 μm or more and 2 μm or less. The piezoelectric layer 20 can be deformed by applying voltage between the first electrode 10 and the second electrode 30.

The piezoelectric layer 20 contains a complex oxide having a perovskite structure and including potassium (K), sodium (Na), and niobium (Nb). The piezoelectric layer 20 is a KNN layer formed of KNN, for example. The piezoelectric layer 20 may further contain manganese (Mn). In other words, the piezoelectric layer 20 may be a KNNM layer, which is a KNN layer added with manganese. By incorporating manganese into the piezoelectric layer 20, the leakage current of the piezoelectric element 100 can be reduced. As described here, the piezoelectric layer 20 may contain an additive other than potassium, sodium, niobium, and oxygen (O). Examples of such an additive include calcium (Ca), in addition to manganese.

The piezoelectric layer 20 is formed, for example, by stacking a first layer 22 and a plurality of second layers 24.

The piezoelectric layer 20 includes one first layer 22. The first layer 22 is provided between the first electrode 10 and the second layers 24. The thickness of the first layer 22 is 80 nm or less, for example, and preferably 75 nm or less. The first layer 22 contains a complex oxide having a perovskite structure and including potassium, sodium, and niobium.

The piezoelectric layer 20 includes a plurality of the second layers 24. The number of the second layers 24 is not particularly limited and is 5 layers or more and 30 layers or less, for example. The second layers 24 are provided between the first layer 22 and the second electrode 30. The thickness of the second layer 24 is 60 nm or less, for example, and preferably 51 nm or less. The second layer 24 contains a complex oxide having a perovskite structure and including potassium, sodium, and niobium.

A ratio of potassium to sodium atom concentrations in the first layer 22 is different from a ratio of potassium to sodium atom concentrations in the second layer 24. A ratio $R_{K/Na}$ of a potassium atom concentration to a sodium atom concentration in the first layer 22 is smaller than a ratio $R_{K/Na}$ in the second layer 24, for example. The ratio of potassium to sodium atom concentrations in the first layer 22 and the ratio of potassium to sodium atom concentrations in the second layer 24 can be determined by EDX (energy dispersive X-ray spectrometry).

Figure 2:
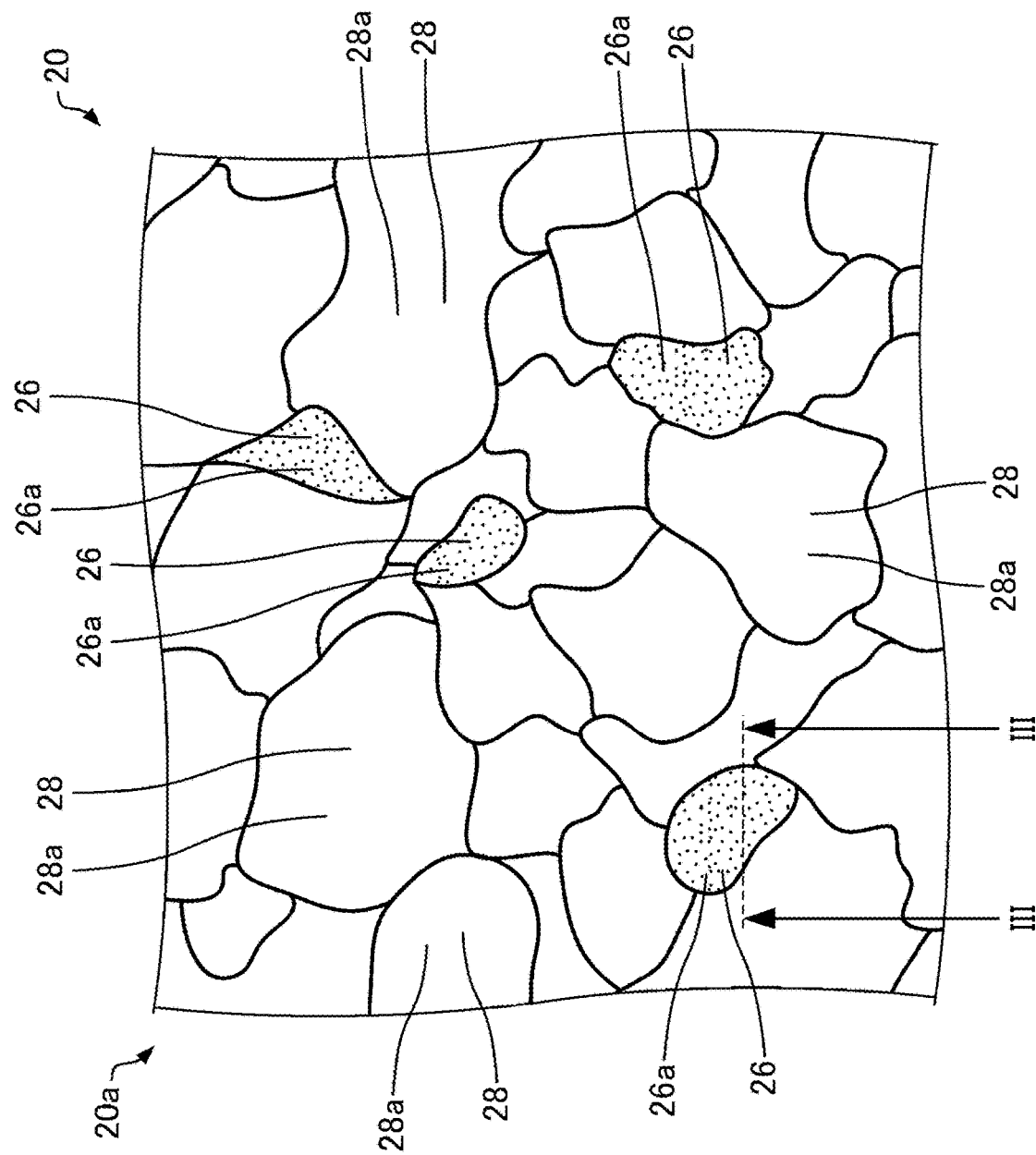
FIG. 2 is a plan view schematically illustrating a surface of a piezoelectric layer of the piezoelectric element according to the embodiment.
Figure 3:
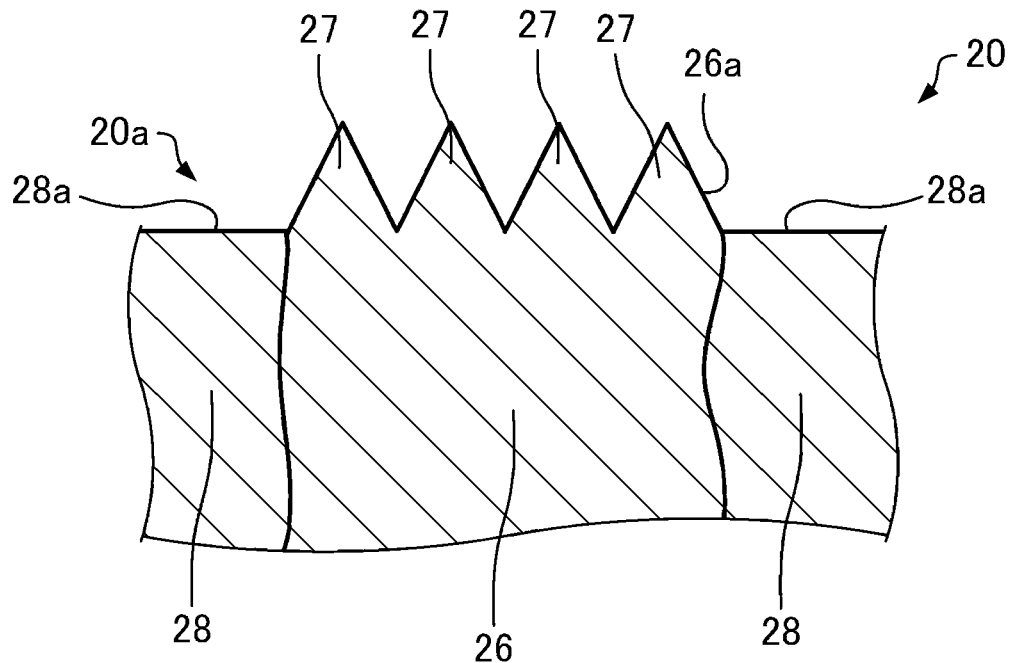
FIG. 3 is a cross-sectional view schematically illustrating the piezoelectric layer of the piezoelectric element according to the embodiment.

The piezoelectric layer 20 has a surface 20a. The surface 20a is a surface of the piezoelectric layer 20 on the second electrode 30 side. In the illustrated example, the surface 20a is an upper surface of the piezoelectric layer 20 as well as a contact surface with the second electrode 30. The surface 20a is a surface positioned between the first electrode 10 and the second electrode 30. Here, FIG. 2 is a plan view schematically illustrating the surface 20a of the piezoelectric layer 20. FIG. 3 is a cross-sectional view along line III-III of FIG. 2 schematically illustrating the piezoelectric layer 20.

As illustrated in FIGS. 2 and 3, the surface 20a of the piezoelectric layer 20 is composed of the faces 26a of first grains 26 and the faces 28a of second grains 28. The first grains 26 and the second grains 28 are crystal grains and are single crystals that constitute the piezoelectric layer 20. A plurality of the first grains 26 and a plurality of the second grains 28 are formed.

A roughness height on the faces 26a of the first grains 26 is larger than a roughness height on the faces 28a of the second grains 28. Herein, the "roughness height on the face of a grain" means a difference between the highest position and the lowest position on the face of a grain. Such a "roughness height on the face of a grain" can be determined by cross-sectional observation under a scanning transmission electron microscope (STEM), for example.

Figure 4:
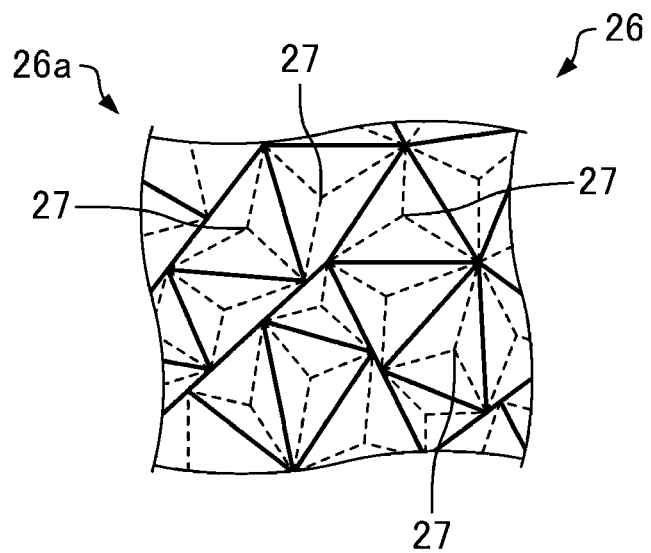
FIG. 4 is a plan view schematically illustrating a face of a first grain of the piezoelectric element according to the embodiment.

The roughness height on the faces 26a of the first grains 26 is 5 nm or more and 30 nm or less, for example. Here, FIG. 4 is a plan view schematically illustrating the face 26a of the first grain 26. As illustrated in FIGS. 3 and 4, the first grain 26 has a plurality of protrusions 27, and the face 26a has a concavo-convex shape due to a plurality of the protrusions 27. The first grain 26 is a faceted grain whose face 26a has a concavo-convex shape due to a plurality of the protrusions 27. The roughness height on the face 26a is the height of the highest protrusion 27 among a plurality of the protrusions 27. The protrusions 27 have a triangular pyramidal shape. In FIG. 4, the ridge lines of the triangular pyramidal protrusions 27 are shown with dashed lines.

The roughness height on the face 28a of the second grain 28 is 0 nm or more and less than 5 nm, for example. The face 28a is a flat face, for example. In the example illustrated in FIG. 2, a plurality of the faces 28a are formed surrounding one face 26a when viewed in plan.

When the crystal structure of the piezoelectric layer 20 is regarded as pseudo-cubic, the first grains 26 are (111)-oriented. In other words, the first grains 26 are (111)-oriented grains, and the faces 26a are the (111)plane. The second grains 28 are (100)-oriented. In other words, the second grains 28 are (100)-oriented grains, and the faces 28a are the (100)plane.

On the surface 20a of the piezoelectric layer 20, an area occupied by the faces 26a of the first grains 26 is 10.0% or less and preferably 9.5% or less. Accordingly, the piezoelectric layer 20 has (100) preferred orientation. The area occupied by the faces 26a of the first grains 26 herein means a ratio of the total area of a plurality of the faces 26a relative to the area of the surface 20a of the piezoelectric layer 20. The area occupied by the faces 26a of the first grains 26 can be determined by using a scanning electron microscope (SEM), for example.

Herein, "(100) preferred orientation" refers to an orientation fraction F represented by the following formula (1) of 80% or more, where a peak intensity of (100)plane is $I_{(100)}$, a peak intensity of (110)plane is $I_{(110)}$, and a peak intensity of (111)plane is $I_{(111)}$ in an X-ray profile obtained by X-ray diffraction (XRD) measurement. Although termed an orientation fraction, F is one of mere evaluation indicators and does not represent a volume fraction of orientation in the piezoelectric layer 20.

$$F = I_{(100)}/(I_{(100)} + I_{(110)} + I_{(111)}) \times 100 \quad (1)$$

The second electrode 30 is provided on the piezoelectric layer 20. Although not shown, the second electrode 30 may be further provided on the side surface of the piezoelectric layer 20 and on the base 2 provided that the second electrode 30 is electrically separated from the first electrode 10.

The form of the second electrode 30 is layered, for example. The thickness of the second electrode 30 is 15 nm or more and 300 nm or less, for example. The second electrode 30 is a metal layer, such as an iridium layer, a platinum layer, or a ruthenium layer; a conducting oxide layer thereof; a strontium ruthenate layer; or a lanthanum nickel oxide layer ($LaNiO_3$: LNO), for example. The second electrode 30 may have a structure in which a plurality of the above-mentioned exemplary layers are stacked.

The second electrode 30 is the other electrode for applying voltage to the piezoelectric layer 20. The second electrode 30 is an upper electrode provided on the piezoelectric layer 20.

The piezoelectric element 100 has the following features, for example.

In the piezoelectric element 100, the surface 20a of the piezoelectric layer 20 on the side of the second electrode 30 is composed of the faces 26a of the first grains 26 and the faces 28a of the second grains 28; a roughness height on the faces 26a of the first grains 26 is larger than a roughness height on the faces 28a of the second grains 28; and an area occupied by the faces 26a of the first grains 26 is 10.0% or less on the surface 20a of the piezoelectric layer 20. Consequently, cracking is less likely to arise in the piezoelectric element 100 compared with a case in which an area occupied by the faces of the first grains is more than 10.0% on the surface of the piezoelectric layer, as demonstrated in the "5. Examples and Comparative Examples" section described hereinafter.

In the piezoelectric element 100, the thickness of the piezoelectric layer 20 is 500 nm or more and 2 μm or less. Consequently, the piezoelectric element 100 can suppress the occurrence of cracking in the piezoelectric layer 20 while increasing the amount of displacement in a diaphragm by the piezoelectric layer 20.

In the piezoelectric element 100, the thickness of the first layer 22 is 75 nm or less, and the thickness of the second layer 24 is 51 nm or less. Consequently, the piezoelectric element 100 can achieve an area occupied by the faces 26a of the first grains 26 of 10.0% or less on the surface 20a of the piezoelectric layer 20.

2. Manufacturing Method For Piezoelectric Element

Next, a manufacturing method for the piezoelectric element 100 according to the embodiment will be described with reference to the drawings.

As illustrated in FIG. 1, the base 2 is prepared. Specifically, a silicon oxide layer is formed by thermally oxidizing a silicon substrate. Subsequently, a zirconium oxide layer is formed by depositing a zirconium layer on the silicon oxide layer by sputtering or the like and thermally oxidizing the zirconium layer. Through the above steps, the base 2 can be prepared.

Next, the first electrode 10 is formed on the base 2. The first electrode 10 is formed by sputtering or vacuum vapor deposition, for example. The first electrode 10 is then patterned by photolithography and etching, for example.

Subsequently, the piezoelectric layer 20 is formed on the first electrode 10. The piezoelectric layer 20 is formed, for example, by a chemical solution deposition (CSD), such as a sol-gel process or metal-organic deposition. Hereinafter, a forming method for the piezoelectric layer 20 will be described.

First, a precursor solution is prepared, for example, by dissolving or dispersing in an organic solvent a metal complex containing potassium, a metal complex containing sodium, a metal complex containing niobium, and a metal complex containing manganese.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate, niobium ethoxide, and pentabutoxyniobium. Examples of the metal complex containing manganese include manganese 2-ethylhexanoate and manganese acetate. Here, two or more metal complexes may be used in combination. For example, potassium 2-ethylhexanoate and potassium acetate may be used in combination as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, 2-ethylhexanoic acid, 2-n-butoxyethanol, n-octane, 2-ethyl hexanoic acid, and mixed solvents thereof.

Next, the prepared precursor solution is applied to the first electrode 10 by spin coating or the like, thereby forming a precursor layer. The precursor layer is then dried for a certain time by heating at 130° C. or higher and 250° C. or lower, for example. The dried precursor layer is degreased, for example, by further heating at 300° C. or higher and 450° C. or lower and retaining for a certain time. Subsequently, the degreased precursor layer is crystallized by firing at 550° C. or higher and 800° C. or lower, for example.

Through the above steps, the first layer 22 of the piezoelectric layer 20 can be formed. Further, another precursor solution is prepared by changing a ratio of the potassium atom concentration to the sodium atom concentration, and the above-described series of steps from the application of the precursor solution to the firing of the precursor layer are repeated a plurality of times. As a result, the piezoelectric layer 20 composed of the first layer 22 and a plurality of the second layers 24 can be formed.

A heating apparatus used for drying and degreasing of the precursor layer is a hot plate, for example. A heating apparatus used for firing of the precursor layer is an infrared lamp annealing (rapid thermal annealing: RTA) apparatus.

Next, the second electrode 30 is formed on the piezoelectric layer 20. The second electrode 30 is formed by sputtering or vacuum vapor deposition, for example. The second electrode 30 and the piezoelectric layer 20 are then patterned by photolithography and etching, for example. Here, the second electrode 30 and the piezoelectric layer 20 may be patterned in separate steps.

Through the above steps, the piezoelectric element 100 can be manufactured.

3. Liquid Discharge Head

Figure 5:
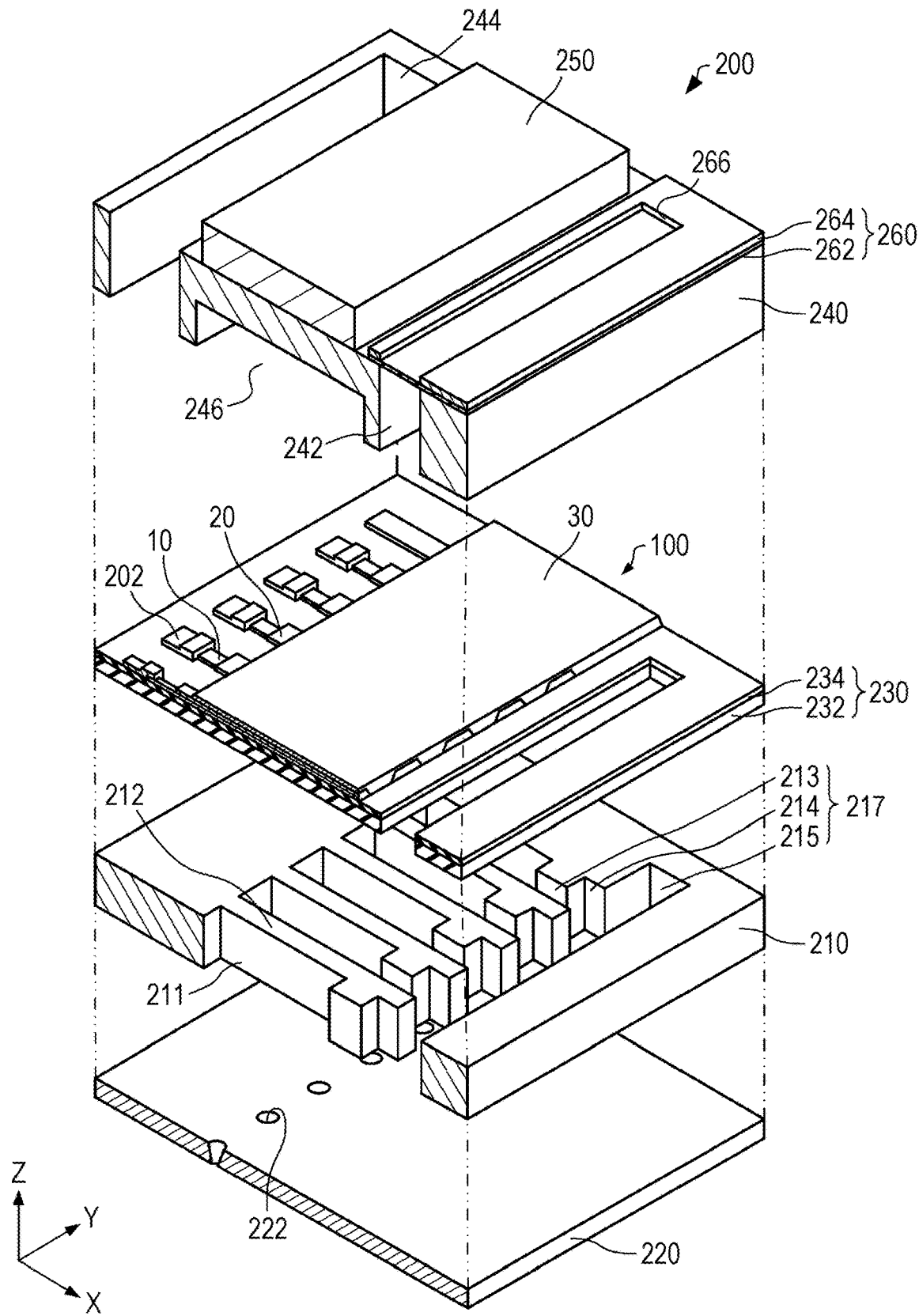
FIG. 5 is an exploded perspective view schematically illustrating a liquid discharge head according to an embodiment.
Figure 6:
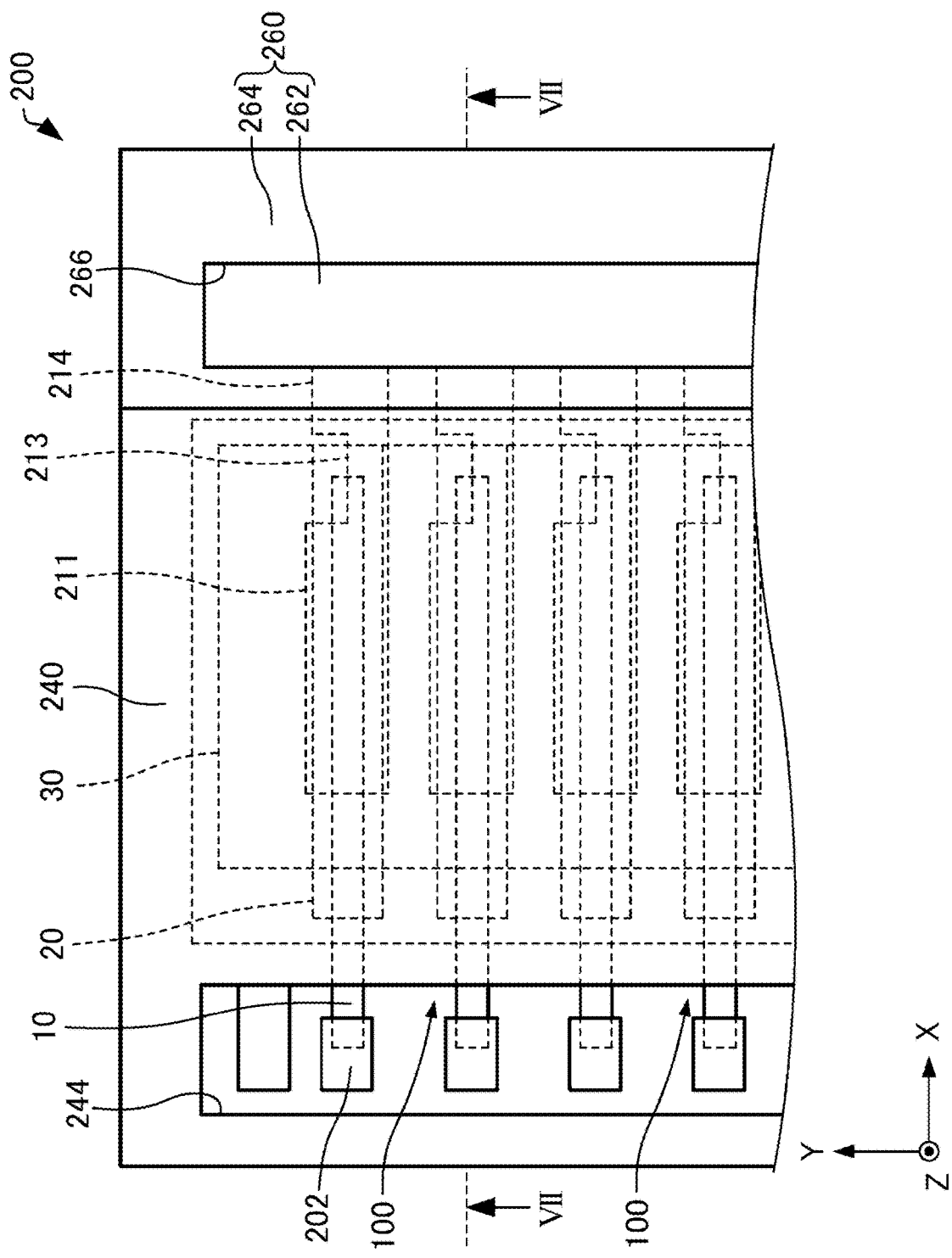
FIG. 6 is a plan view schematically illustrating the liquid discharge head according to the embodiment.
Figure 7:
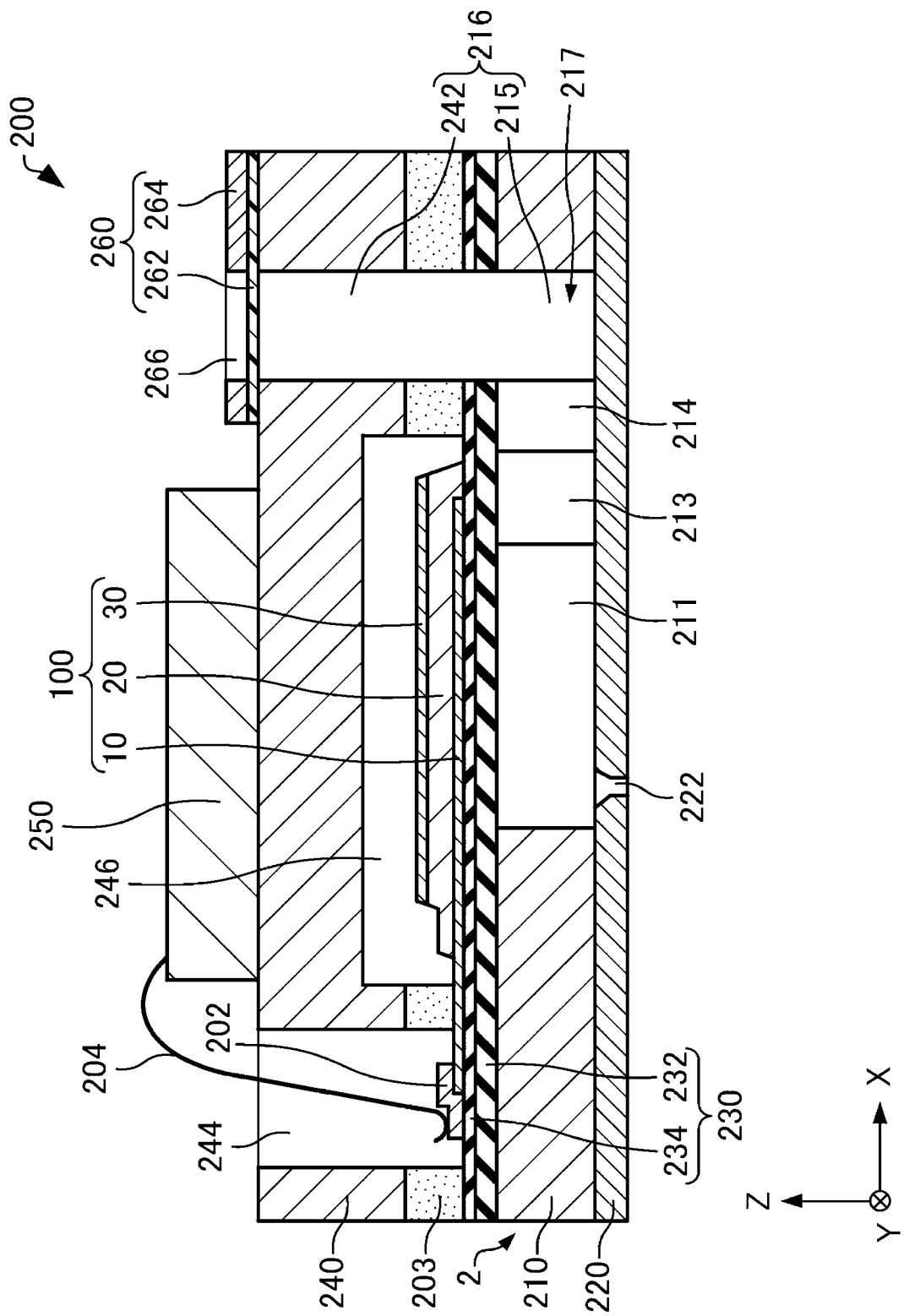
FIG. 7 is a cross-sectional view schematically illustrating the liquid discharge head according to the embodiment.

Next, a liquid discharge head according to an embodiment will be described with reference to the drawings. FIG. 5 is an exploded perspective view schematically illustrating a liquid discharge head 200 according to an embodiment. FIG. 6 is a plan view schematically illustrating the liquid discharge head 200 according to the embodiment. FIG. 7 is a cross-sectional view along line VII-VII of FIG. 6 schematically illustrating the liquid discharge head 200 according to the embodiment. Here, in FIGS. 5 to 7, the X-axis, the Y-axis, and the Z-axis are illustrated as three mutually orthogonal axes. Moreover, In FIGS. 5 and 7, the piezoelectric element 100 is simplified for illustration.

As illustrated in FIGS. 5 to 7, the liquid discharge head 200 includes the base 2, the piezoelectric element 100, a nozzle plate 220, a protective substrate 240, a circuit board 250, and a compliant substrate 260, for example. The base 2 includes a channel-formed substrate 210 and a diaphragm 230. Here, for convenience, the circuit board 250 is omitted from the illustration in FIG. 6.

The channel-formed substrate 210 is a silicon substrate, for example. The channel-formed substrate 210 is provided with a pressure chamber 211. The pressure chamber 211 is partitioned by a plurality of partition walls 212. The pressure chamber 211 changes the volume by the piezoelectric element 100.

In the +X-axis direction end of each pressure chamber 211 of the channel-formed substrate 210, a first communicating path 213 and a second communicating path 214 are provided. The first communicating path 213 is formed to reduce the opening area by narrowing the +X-axis direction end of the pressure chamber 211 in the Y-axis direction. The size in the Y-axis direction of the second communicating path 214 is the same as the size in the Y-axis direction of the pressure chamber 211, for example. In the +X-axis direction of the second communicating path 214, a third communicating path 215 connected with a plurality of the second communicating paths 214 is provided. The third communicating path 215 constitutes a part of a manifold 216. The manifold 216 functions as a common liquid chamber among the respective pressure chambers 211. As described above, the channel-formed substrate 210 is provided with the pressure chambers 211 and supply channels 217 composed of the first communicating paths 213, the second communicating paths 214, and the third communicating path 215. The supply channels 217 are connected with the respective pressure chambers 211 and supply a liquid to the pressure chambers 211.

The nozzle plate 220 is provided on one surface of the channel-formed substrate 210. The material of the nozzle plate 220 is SUS (steel use stainless), for example. The nozzle plate 220 is joined to the channel-formed substrate 210 by an adhesive or a heat-sealing film, for example. The nozzle plate 220 is provided with a plurality of nozzle holes 222 along the Y-axis. The nozzle holes 222 are connected with the respective pressure chambers 211 and discharge a liquid.

The diaphragm 230 is provided on the other surface of the channel-formed substrate 210. The diaphragm 230 is formed, for example, from a silicon oxide layer 232 provided on the channel-formed substrate 210 and a zirconium oxide layer 234 provided on the silicon oxide layer 232.

The piezoelectric element 100 is provided on the diaphragm 230, for example. A plurality of the piezoelectric elements 100 are provided. The number of the piezoelectric elements 100 is not particularly limited.

In the liquid discharge head 200, the diaphragm 230 and the first electrode 10 are displaced by deformation of the piezoelectric layer 20 that exhibits electromechanical conversion characteristics. In other words, in the liquid discharge head 200, the diaphragm 230 and the first electrode 10 substantially function as a diaphragm. Here, the first electrode 10 alone may function as a diaphragm by omitting the diaphragm 230. When the first electrode 10 is directly provided on the channel-formed substrate 210, the first electrode 10 is preferably protected with an insulating protective film or the like to avoid contact of the first electrode 10 with a liquid.

The first electrode 10 is formed as an independent, individual electrode for every pressure chamber 211. The size of the first electrode 10 in the Y-axis direction is smaller than the size of the pressure chamber 211 in the Y-axis direction. The size of the first electrode 10 in the X-axis direction is larger than the size of the pressure chamber 211 in the X-axis direction. In the X-axis direction, both ends of the first electrode 10 are positioned outside both ends of the pressure chamber 211. The −X-axis direction end of the first electrode 10 is coupled to a lead electrode 202.

The size of the piezoelectric layer 20 in the Y-axis direction is larger than the size of the first electrode 10 in the Y-axis direction, for example. The size of the piezoelectric layer 20 in the X-axis direction is larger than the size of the pressure chamber 211 in the X-axis direction, for example. The +X-axis direction end of the piezoelectric layer 20 is positioned outside the +X-axis direction end of the first electrode 10, for example. The +X-axis direction end of the first electrode 10 is covered with the piezoelectric layer 20. Meanwhile, the −X-axis direction end of the piezoelectric layer 20 is positioned on the inner side of the −X-axis direction end of the first electrode 10, for example. The −X-axis direction end of the first electrode 10 is not covered with the piezoelectric layer 20.

The second electrode 30 is provided, for example, on the piezoelectric layer 20 and the diaphragm 230 in a continuous manner. The second electrode 30 is formed as a common electrode shared by a plurality of the piezoelectric elements 100.

The protective substrate 240 is joined to the channel-formed substrate 210 by an adhesive 203. The protective substrate 240 is provided with a through hole 242. In the illustrated example, the through hole 242 penetrates the protective substrate 240 in the Z-axis direction and is connected with the third communicating path 215. The through hole 242 and the third communicating path 215 constitute the manifold 216 that functions as a common liquid chamber among the respective pressure chambers 211. Moreover, the protective substrate 240 is provided with a through hole 244 that penetrates the protective substrate 240 in the Z-axis direction. In the through hole 244, the ends of the lead electrodes 202 are positioned.

The protective substrate 240 is further provided with an opening 246. The opening 246 is a space for allowing the driving of the piezoelectric elements 100 without interference. The opening 246 may be sealed or not.

The circuit board 250 is provided on the protective substrate 240. The circuit board 250 includes an integrated circuit (IC) for driving the piezoelectric elements 100. The circuit board 250 and the lead electrodes 202 are electrically coupled through connecting wiring 204.

The compliant substrate 260 is provided on the protective substrate 240. The compliant substrate 260 includes a sealing layer 262 provided on the protective substrate 240 and a fixing sheet 264 provided on the sealing layer 262. The sealing layer 262 is a layer for sealing the manifold 216. The sealing layer 262 exhibits flexibility, for example. The fixing sheet 264 is provided with a through hole 266. The through hole 266 penetrates the fixing sheet 264 in the Z-axis direction. The through hole 266 is provided at a position overlapping the manifold 216 when viewed in the Z-axis direction.

4. Printer

Figure 8:
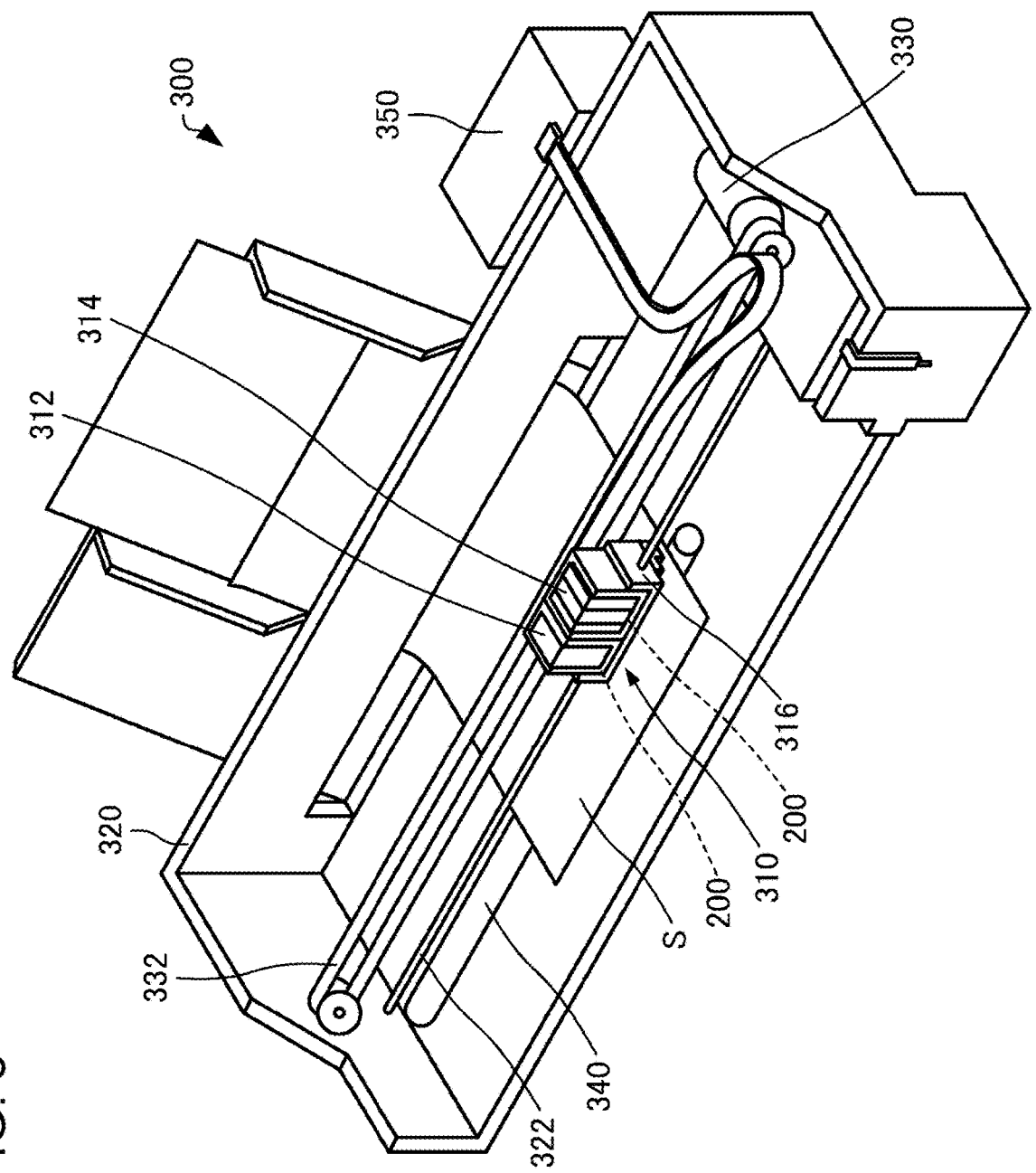
FIG. 8 is a perspective view schematically illustrating a printer according to an embodiment.

Next, a printer according to an embodiment will be described with reference to the drawings. FIG. 8 is a perspective view schematically illustrating a printer 300 according to an embodiment.

The printer 300 is an ink jet-mode printer. The printer 300 includes a head unit 310, as illustrated in FIG. 8. The head unit 310 includes liquid discharge heads 200, for example. The number of the liquid discharge heads 200 is not particularly limited. The head unit 310 is provided with detachable cartridges 312 and 314 that constitute a supply means. A carriage 316, on which the head unit 310 is mounted, is provided on a carriage shaft 322, which is fixed to an apparatus body 320, so as to be freely movable in the axial direction and discharges a liquid supplied from the liquid supply means.

A liquid herein may be a material in a state where a substance is in the liquid phase, and a material in the liquid state, such as sol or gel, is also included in the liquid. Moreover, such liquids encompass, for example, not only a liquid as a state of a substance, but also a solvent in which particles of a solid functional material, such as pigment or metal particles, are dissolved, dispersed, or mixed. Representative examples of liquids include ink and liquid crystal emulsifiers. The ink herein encompasses various liquid compositions, such as common aqueous ink and oil-based ink, gel ink, and hot-melt ink.

In the printer 300, the carriage 316, on which the head unit 310 is mounted, is moved along the carriage shaft 322 by transmitting the driving force of a driving motor 330 to the carriage 316 through a plurality of gears not shown and a timing belt 332. Meanwhile, the apparatus body 320 is provided with a transport roller 340 as a transport mechanism for moving a sheet S, which is paper or other recording media, relative to the liquid discharge heads 200. The transport mechanism for transporting the sheet S is not limited to a transport roller and may be a belt, a drum, or the like.

The printer 300 includes a printer controller 350 as a control unit for controlling the liquid discharge heads 200 and the transport roller 340. The printer controller 350 is electrically coupled to circuit boards 250 of the liquid discharge heads 200. The printer controller 350 is equipped with RAM (random access memory) for temporarily storing various data, ROM (read only memory) that stores control programs and the like, CPU (central processing unit), and a driving signal generator circuit for generating driving signals to be supplied to the liquid discharge heads 200, for example.

It is noted that the piezoelectric element 100 is applicable to a wide range of uses other than a liquid discharge head and a printer. The piezoelectric element 100 is suitably used, for example, as piezoelectric actuators, such as an ultrasonic motor, a vibration-type dust removal device, a piezoelectric transducer, a piezoelectric speaker, a piezoelectric pump, and a pressure-electricity converter. In addition, the piezoelectric element 100 is also suitably used, for example, as piezoelectric sensor elements, such as an ultrasonic detector, an angular velocity sensor, an acceleration sensor, a vibration sensor, a tilt sensor, a pressure sensor, a collision sensor, a motion sensor, an infrared sensor, a terahertz sensor, a heat detection sensor, a pyroelectric sensor, and a piezoelectric sensor. Moreover, the piezoelectric element 100 is also suitably used as ferroelectric elements, such as a ferroelectric memory (FeRAM), a ferroelectric transistor (FeFET), a ferroelectric arithmetic circuit (FeLogic), and a ferroelectric capacitor. Further, the piezoelectric element 100 is also suitably used as voltage-controlled optical elements, such as a wavelength converter, an optical waveguide, an optical path modulator, a refractive index control element, and an electronic shutter mechanism.

5. Examples and Comparative Examples

Hereinafter, the present disclosure will be further specifically described by means of Examples and Comparative Examples. The present disclosure, however, is by no means limited by the following Examples and Comparative Examples.

5.1. Preparation of Samples

5.1.1. Example 1

In Example 1, a 6-inch silicon substrate was thermally oxidized to form a 1,080 nm-thick silicon dioxide layer on the silicon substrate. Subsequently, a zirconium oxide layer was formed by depositing a 400 nm-thick zirconium layer on the silicon dioxide layer by DC (direct current) sputtering, followed by thermal oxidation. Next, a 50 nm-thick platinum layer as a first electrode was formed on the zirconium oxide layer by DC sputtering.

According to the following procedure, a piezoelectric layer was formed on the platinum layer.

First, potassium acetate and 2-ethylhexanoic acid were mixed and stirred with heating to prepare a mixed solution. The mixed solution was then cooled to room temperature and added with n-octane to yield a potassium 2-ethylhexanoate solution. In a similar manner, a sodium 2-ethylhexanoate solution, a niobium 2-ethylhexanoate solution, and a manganese 2-ethylhexanoate solution were prepared by using sodium acetate, niobium ethoxide, and manganese acetate, respectively.

The respective mixed solutions were then measured for concentrations by inductively coupled plasma (ICP) atomic emission spectroscopy. Subsequently, these mixed solutions were blended in the following ratios to yield a first precursor solution and a second precursor solution.

<First Precursor Solution> K:Na:Nb:Mn=40:60:199:1
<Second Precursor Solution> K:Na:Nb:Mn=103:103:199:1

Next, a first precursor layer was formed by applying the first precursor solution to the platinum layer by spin coating. Subsequently, the first precursor layer was dried on a hot plate at 180° C., then degreased at 380° C., and fired with an RTA apparatus at 750° C. Through the above procedure, a 75 nm-thick first KNNM layer was formed.

A second precursor layer was then formed by applying the second precursor solution to the first KNNM layer by spin coating. Under the same conditions as for the first KNNM layer, a 40 nm-thick second KNNM layer was formed. The series of the steps from the application of the second precursor solution to the firing of the second precursor layer were repeated 23 times, thereby forming a piezoelectric layer.

5.1.2. Example 2

In Example 2, a piezoelectric layer was formed through the same steps as Example 1 except for controlling the thickness of each second KNNM layer to 51 nm by changing spin coating conditions during formation of the second KNNM layers; and for repeating the series of the steps from the application of the second precursor solution to the firing of the second precursor layer 18 times.

5.1.3. Comparative Example 1

In Comparative Example 1, a piezoelectric layer was formed through the same steps as Example 1 except for controlling the thickness of the first KNNM layer to 93 nm by changing spin coating conditions during formation of the first KNNM layer; and for repeating the series of the steps from the application of the second precursor solution to the firing of the second precursor layer 18 times.

5.1.4. Comparative Example 2

In Comparative Example 2, a piezoelectric layer was formed through the same steps as Example 1 except for controlling the thickness of each second KNNM layer to 75 nm by changing spin coating conditions during formation of the second KNNM layers; and for repeating the series of the steps from the application of the second precursor solution to the firing of the second precursor layer 9 times.

5.1.5. Comparative Example 3

In Comparative Example 3, a silicon dioxide layer was formed by thermally oxidizing a 6-inch silicon substrate. Subsequently, an $Al_2O_3$ layer was formed by AL-CVD (atomic layer-chemical vapor deposition), and a platinum layer was formed on the $Al_2O_3$ layer by DC sputtering.

According to the following procedure, a piezoelectric layer was formed.

First, propionic acid was weighed in a beaker and mixed with bismuth acetate, lanthanum acetate, iron acetate, manganese acetate, and tetraisopropoxytitanium at a molar ratio of 85:15:96:1:3. Next, the resulting mixture was stirred with heating on a hot plate at 140° C. for 1 hour and then adjusted to 0.3 mol/L with propionic acid to yield a BLFMT ((Bi,La)(Fe,Mn,Ti)$O_3$) precursor solution.

After that, the precursor solution was applied to the platinum layer by spin coating at 1,500 rpm to form a precursor layer. Subsequently, the precursor layer was heated on a hot plate at 350° C. for 3 minutes. The series of the steps from the application to the heating were repeated twice and then heated with an RTA apparatus in a nitrogen atmosphere at 650° C. for 5 minutes. The series of the steps from the application to the heating with an RTA apparatus were repeated 3 times, thereby forming a piezoelectric layer composed of BLFMT layers.

5.2. XRD Measurement

The crystal structures of Examples 1 and 2 as well as Comparative Examples 1 and 3 were analyzed by XRD measurement. Specifically, XRD measurement was performed at ψ=0° and 54.74° by using "D8 Discover" from Bruker AXS GmbH, CuKα as an X-ray source, and a two-dimensional detector (GADDS) as a detector.

Figure 9:
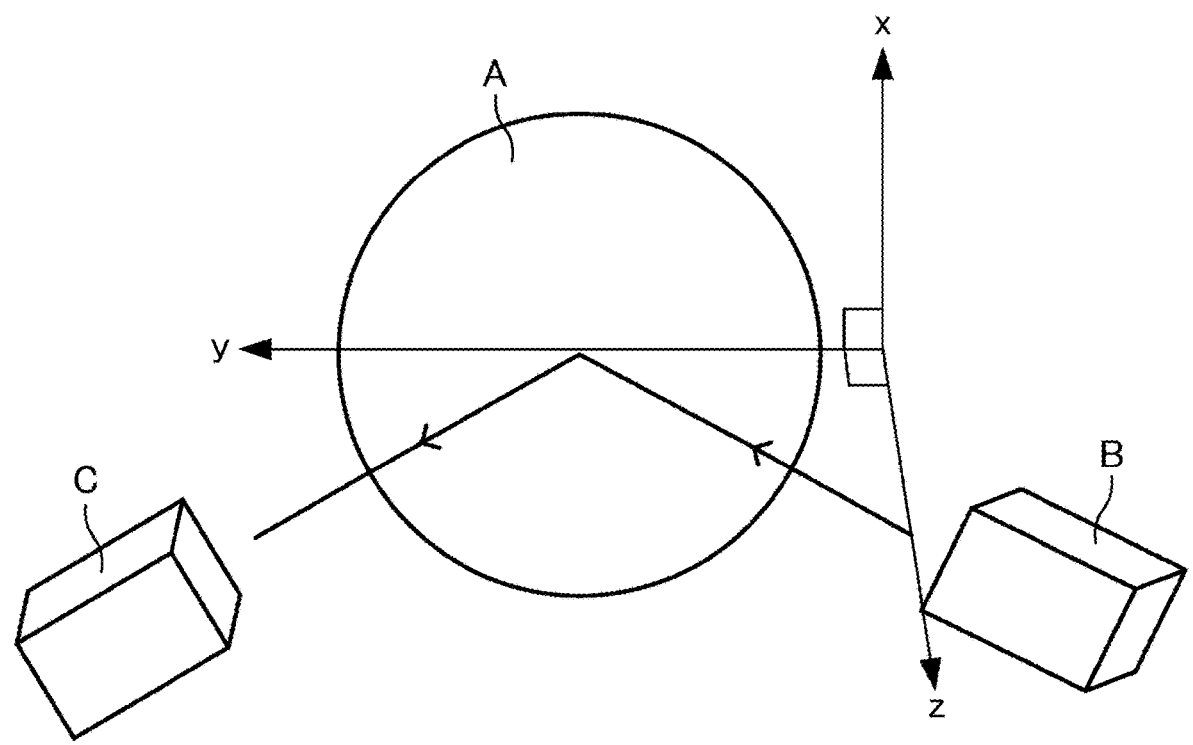
FIG. 9 illustrates XRD measurement at ψ=0°.

In XRD measurement at ψ=0°, as illustrated in FIG. 9, X-rays are emitted from an X-ray source B toward a silicon substrate A at an angle of 90° to reach a detector C. In other words, the measurement at ψ=0° means the same measurement method as common XRD measurement. In FIG. 9, the X-axis, Y-axis, and Z-axis are illustrated as three mutually orthogonal axes. The surface of the silicon substrate is positioned on the xy plane, for example, and X-rays propagate on the yz plane.

When a KNNM layer is regarded as pseudo-cubic and XRD measurement is performed at $\psi=0°$, an intense peak of the (100)plane is known to be observed at near $2\theta=21°$ to 24° for a KNNM layer having (100) preferred orientation. Herein, the structure of a KNNM layer is treated as pseudo-cubic. However, this is an expression for simplifying the explanation and does not deny that a KNNM layer has a crystal structure with low symmetry, such as tetragonal or orthorhombic. Moreover, even if a KNNM layer has a lower symmetry structure, no particular contradiction is incurred.

Figure 10:
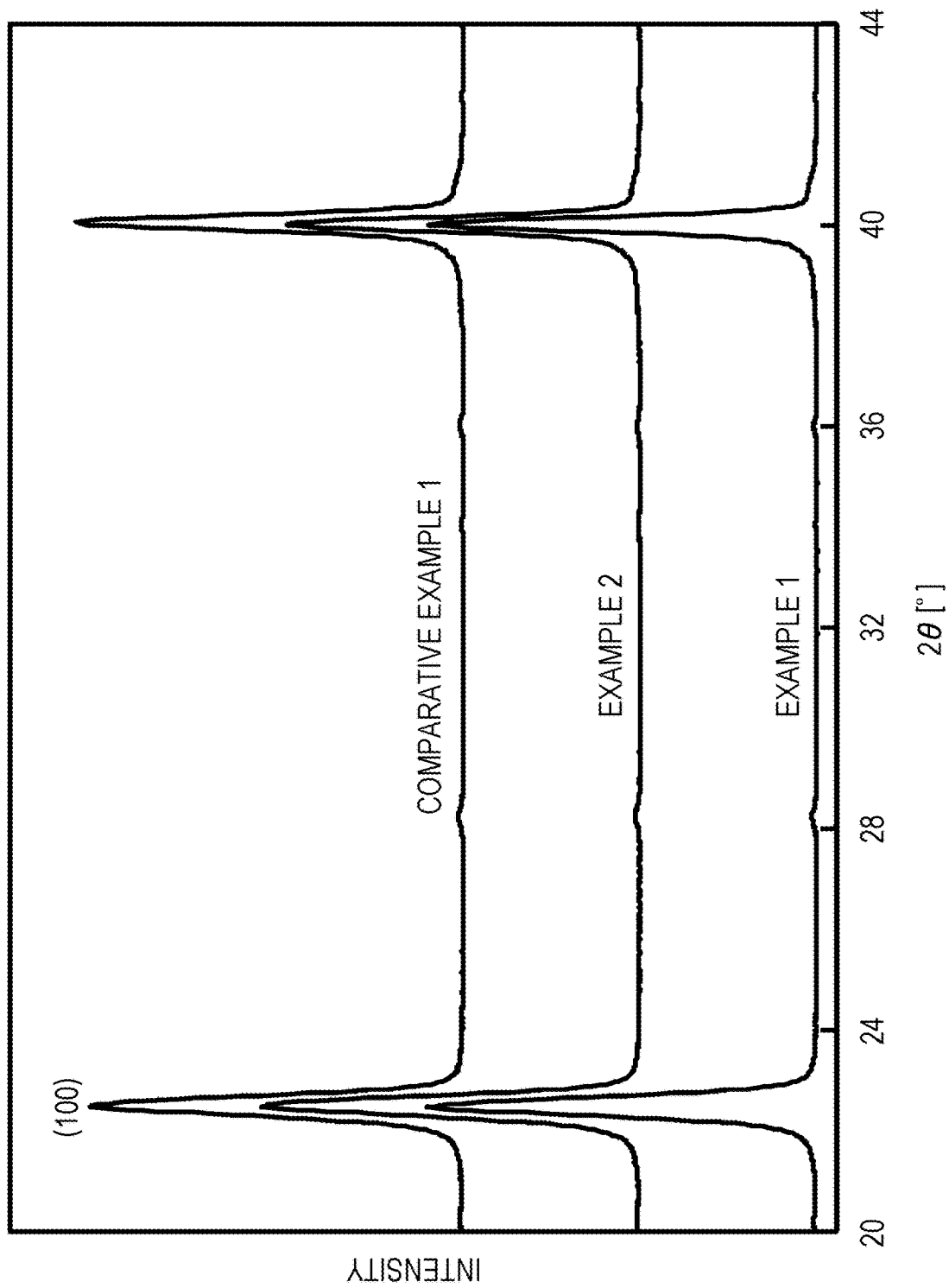
FIG. 10 shows results of XRD measurement at ψ=0° for Examples 1 and 2 and Comparative Example 1.

FIG. 10 shows the results of XRD measurement at $\psi=0°$ for Examples 1 and 2 and Comparative Example 1. As shown in FIG. 10, only the peak of the (100)plane was observed for the KNNM layer in each of Examples 1 and 2 and Comparative Example 1. Here, the peak at near $2\theta=40°$ is the peak of the platinum layer.

Meanwhile, a KNNM layer is known to have an extremely weak peak of the (111)plane in XRD measurement at $\psi=0°$. Accordingly, XRD measurement was also performed at $\psi=54.74°$.

Figure 11:
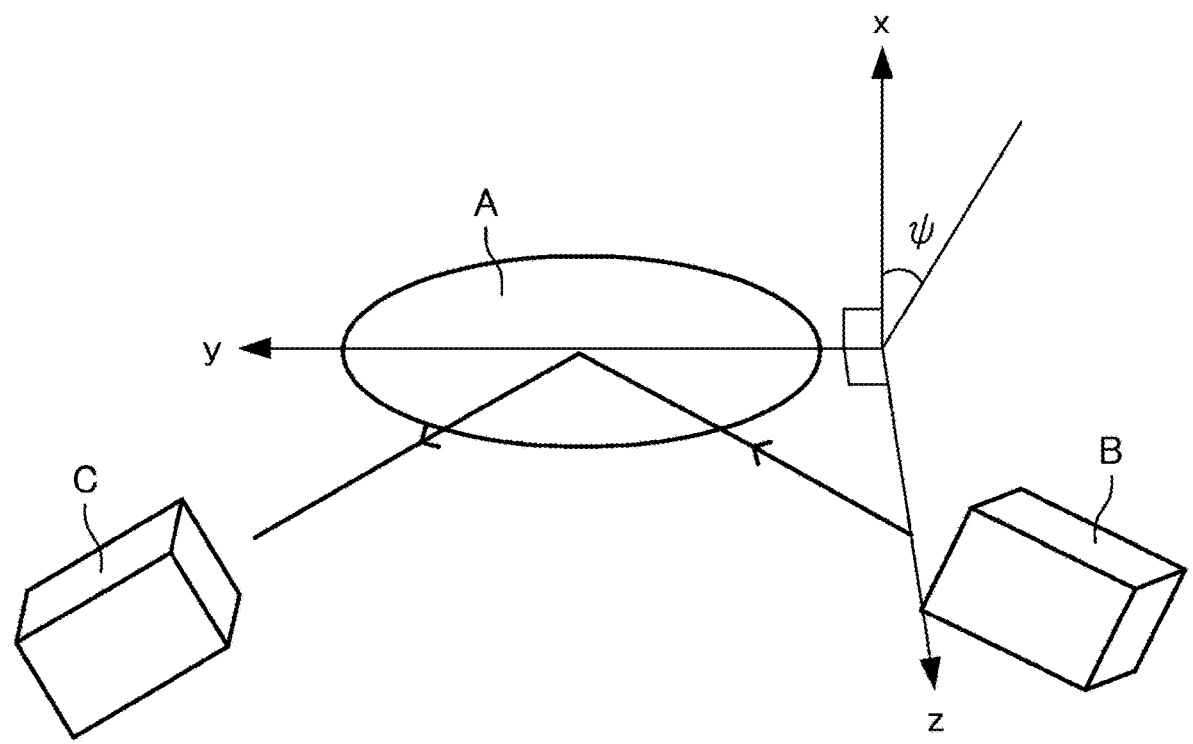
FIG. 11 illustrates XRD measurement at ψ=54.74°.

The XRD measurement at $\psi=54.74°$ is performed while the silicon substrate A in the state illustrated in FIG. 9 is tilted around the X-axis by 54.74° as illustrated in FIG. 11. In a KNNM layer, a peak of the (100)plane that corresponds to the (111)plane is observed at near $2\theta=21°$ to 24°. In other words, a peak of the (111)plane can be observed as a peak of the (100)plane in XRD measurement at $\psi=54.74°$. This is because the angle between the (100)plane and the (111)plane is about 54.74° and a KNNM layer formed by spin coating has a degree of rotational freedom in crystal orientation within the plane of the silicon substrate.

Figure 12:
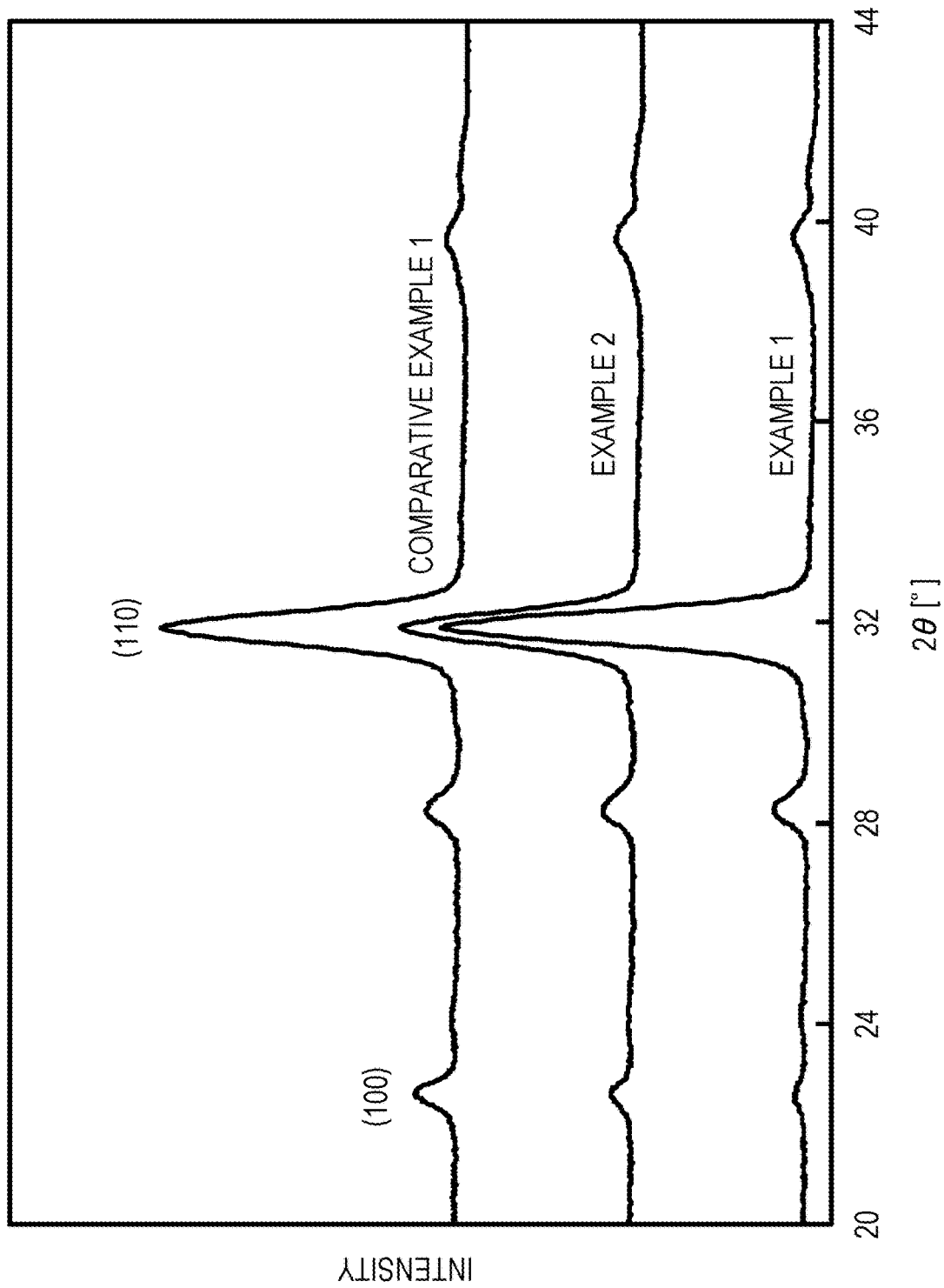
FIG. 12 shows results of XRD measurement at ψ=54.74° for Examples 1 and 2 and Comparative Example 1.

FIG. 12 shows the results of XRD measurement at $\psi=54.74°$ for Examples 1 and 2 and Comparative Example 1. As shown in FIG. 12, it was found that each KNNM layer includes a (111)-oriented component since a peak of the (100)plane is observed in Examples 1 and 2 and Comparative Example 1. In addition, the intensity of the peak was in the order of Example 1<Example 2<Comparative Example 1. This revealed that Comparative Example 1 includes more (111)-oriented component than Examples 1 and 2.

In FIG. 12, each peak at near $2\theta=32°$ is due to the base of a peak of the (110)plane, which corresponds to the (100) plane of a KNNM layer, picked up in the $\psi$ direction.

Figure 13:
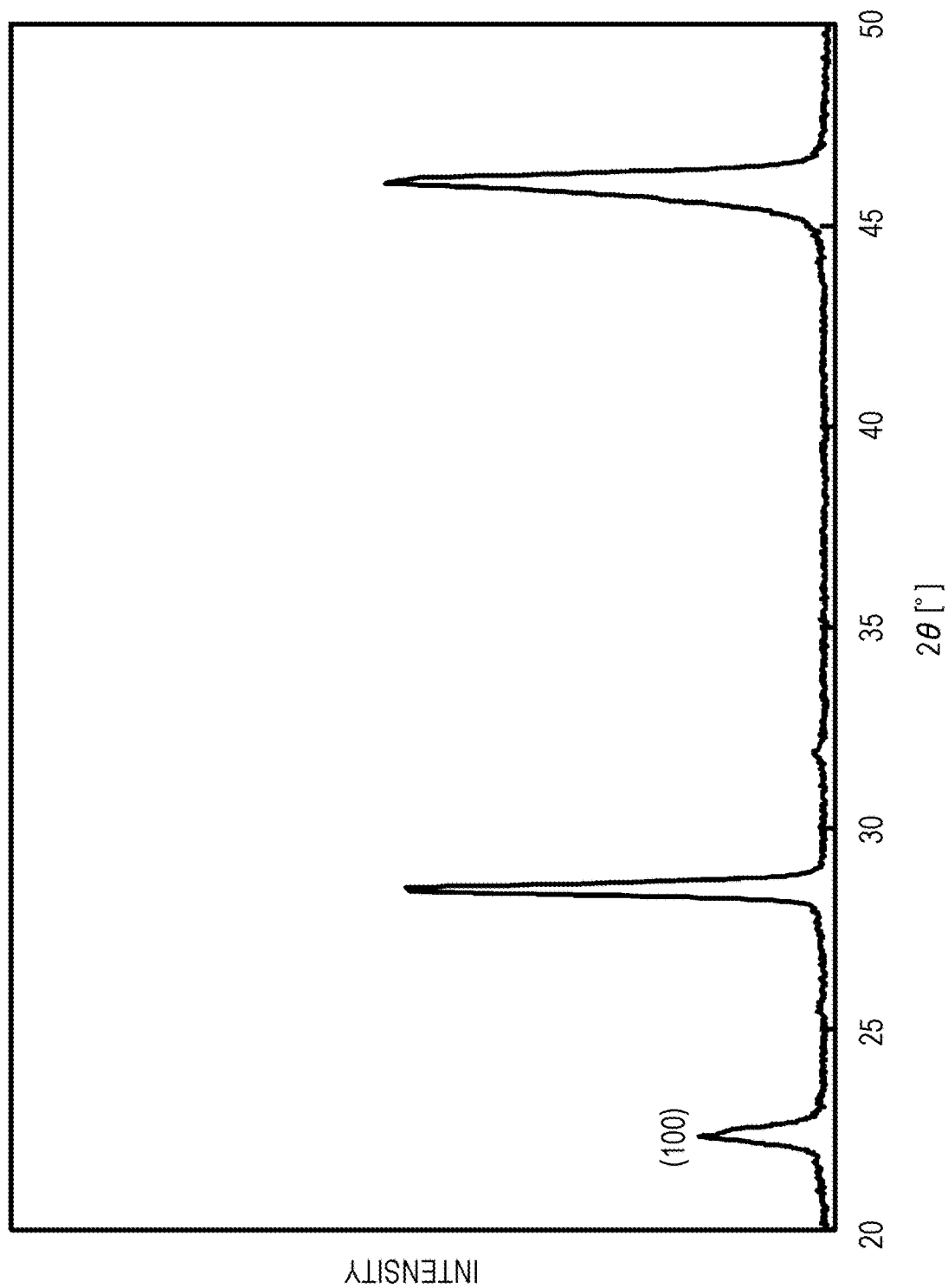
FIG. 13 shows a result of XRD measurement at ψ=54.74° for Comparative Example 3.

FIG. 13 shows the result of XRD measurement at $\psi=54.74°$ for Comparative Example 3. As shown in FIG. 13, only a peak of the (100)plane that corresponds to the (111)plane was observed for the BLFMT layer. This revealed that the BLFMT layer is (111)-oriented.

5.3. Metallurgical Microscope Observation

Figure 14:
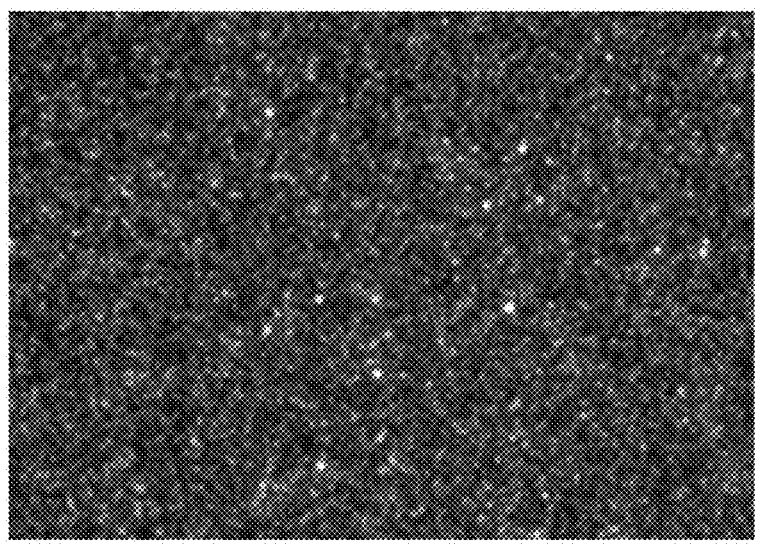
FIG. 14 is a micrograph of Example 1 taken by a metallurgical microscope.
Figure 15:
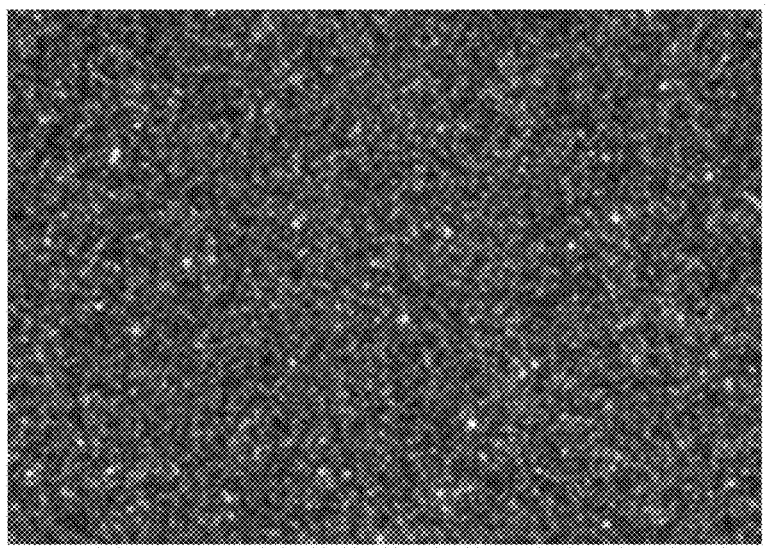
FIG. 15 is a micrograph of Example 2 taken by the metallurgical microscope.
Figure 16:
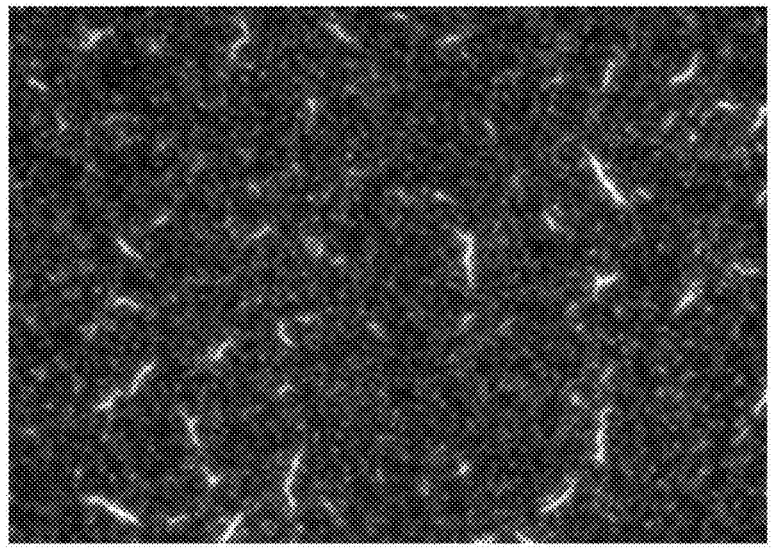
FIG. 16 is a micrograph of Comparative Example 1 taken by the metallurgical microscope.

Cracking in each piezoelectric layer of Examples 1 and 2 and Comparative Example 1 was investigated by dark-field observation with a metallurgical microscope. FIG. 14 is a micrograph of Example 1 taken by a metallurgical microscope. FIG. 15 is a micrograph of Example 2 taken by the metallurgical microscope. FIG. 16 is a micrograph of Comparative Example 1 taken by the metallurgical microscope.

In FIGS. 14 to 16, cracking was not observed for Examples 1 and 2 but was observed for Comparative Example 1. In the dark-field observation with a metallurgical microscope, cracks are observed as white streak regions as shown in FIG. 16.

5.4. SEM Observation

To observe the surface shapes for Examples 1 and 2 and Comparative Example 1, SEM observation was performed by using "ULTRA 55" from Carl Zeiss AG under conditions of an accelerating voltage of 1 kV, an imaging magnification of 30,000×, and an SE2 detector.

Figure 17:
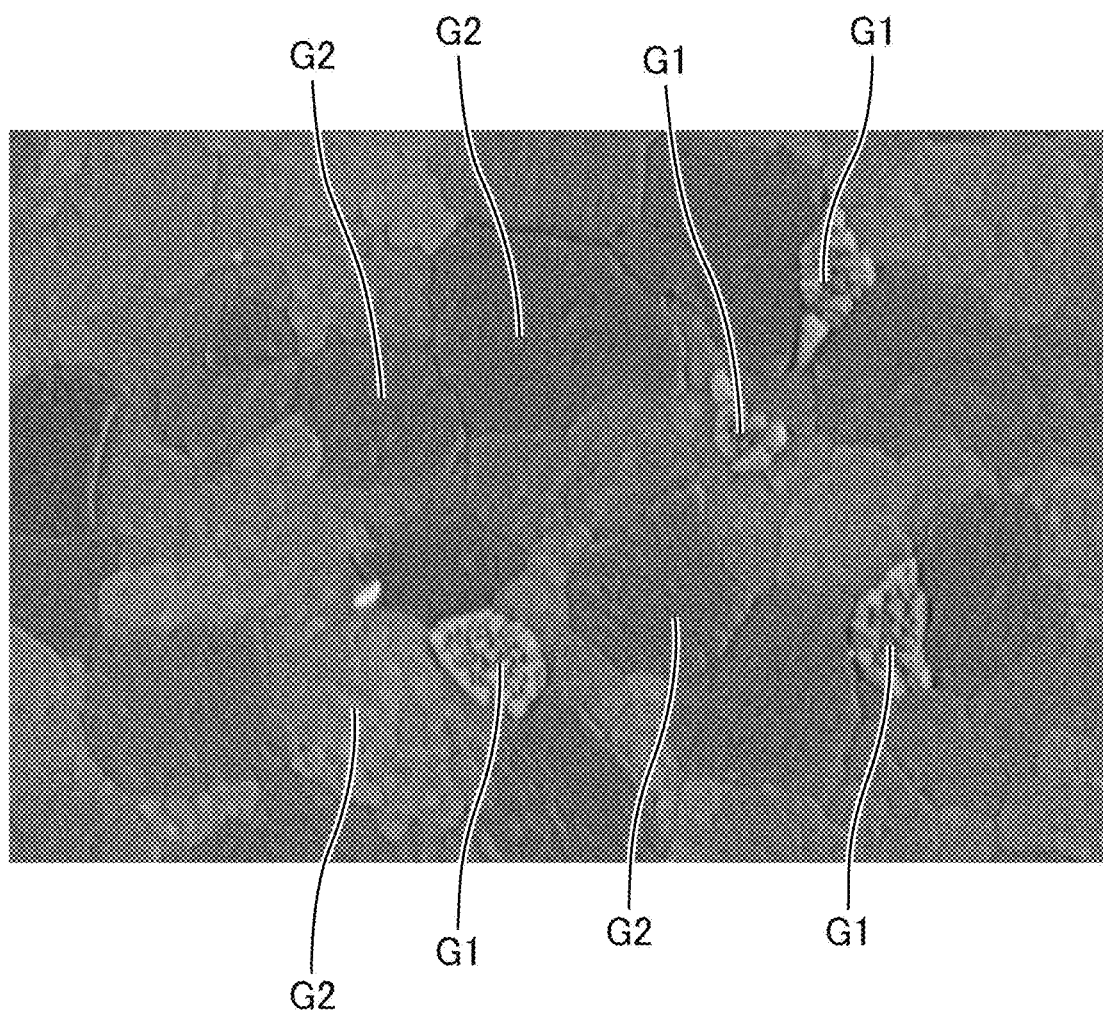
FIG. 17 is an SEM image of Example 1.
Figure 18:
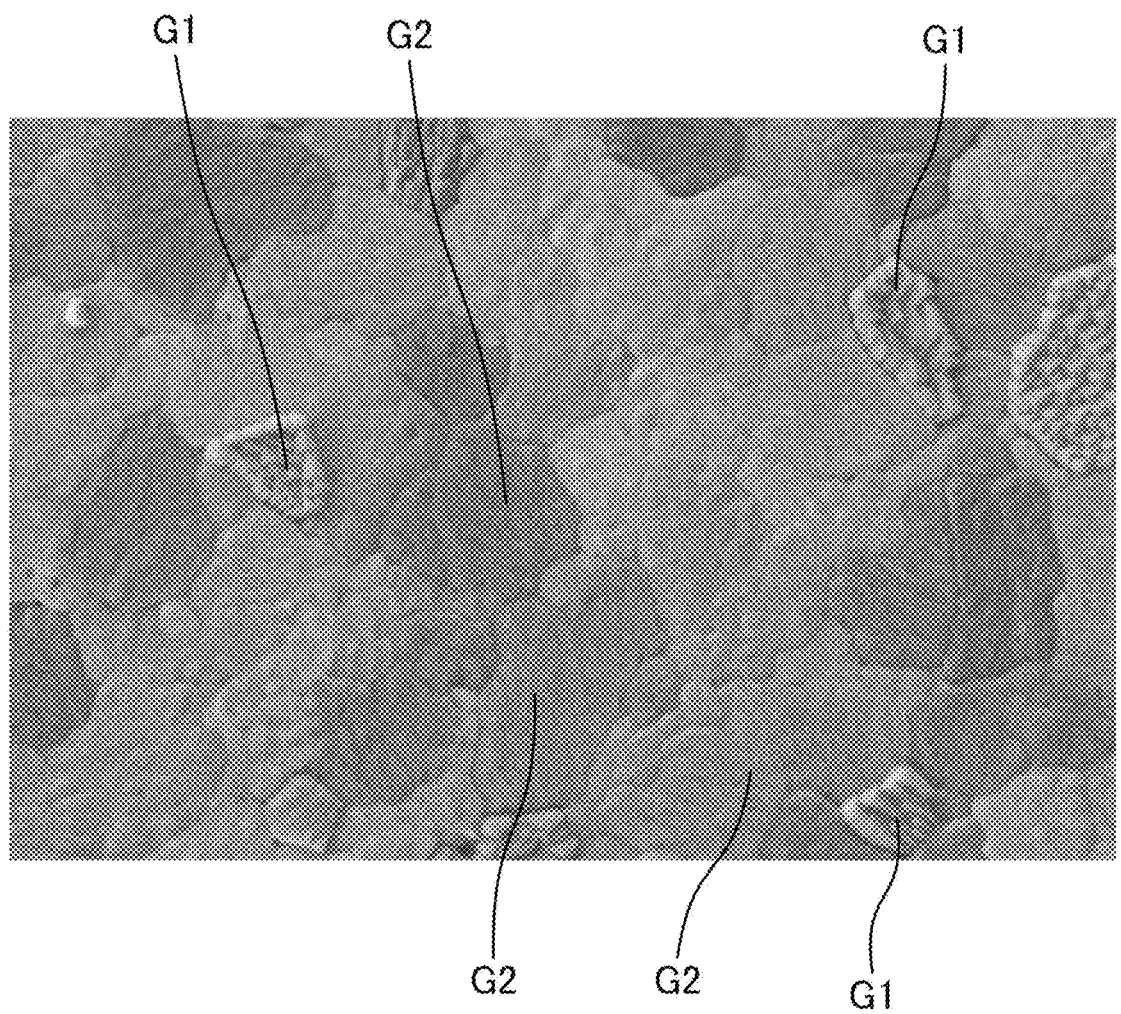
FIG. 18 is an SEM image of Example 2.
Figure 19:
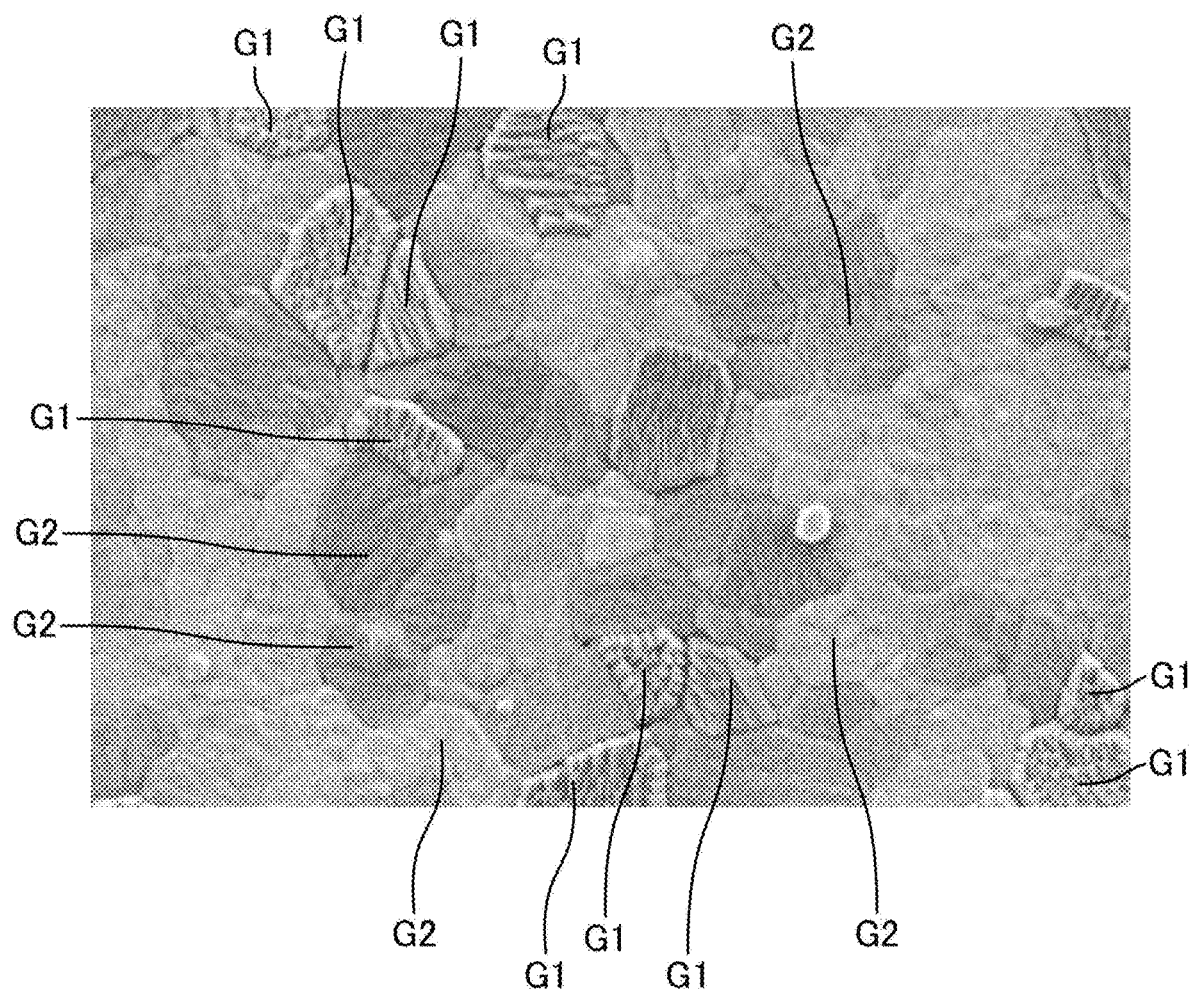
FIG. 19 is an SEM image of Comparative Example 1.

FIG. 17 is an SEM image of Example 1, FIG. 18 is an SEM image of Example 2, and FIG. 19 is an SEM image of Comparative Example 1. As shown in FIGS. 17 to 19, it was found that two types of the faces of first grains G1 having a large roughness height and the faces of second grains G2 having a small roughness height exist on the respective surfaces of Examples 1 and 2 and Comparative Example 1.

FIG. 20 shows an area occupied by the faces of the first grains G1 calculated from area ratios of the faces of the first grains G1 and the faces of the second grains G2 on SEM images. The occupied area is a result determined for four or more images on the basis of machine learning of the surface shapes of the first grain G1 faces and the second grain G2 faces.

For machine learning, "Trainable Weka Segmentation plugin" developed by The University of Waikato and contained in the package "Fiji" of "ImageJ" developed by National Institutes of Health (NIH) was used. The size of an image is 1024×690 pixels.

Figure 21:
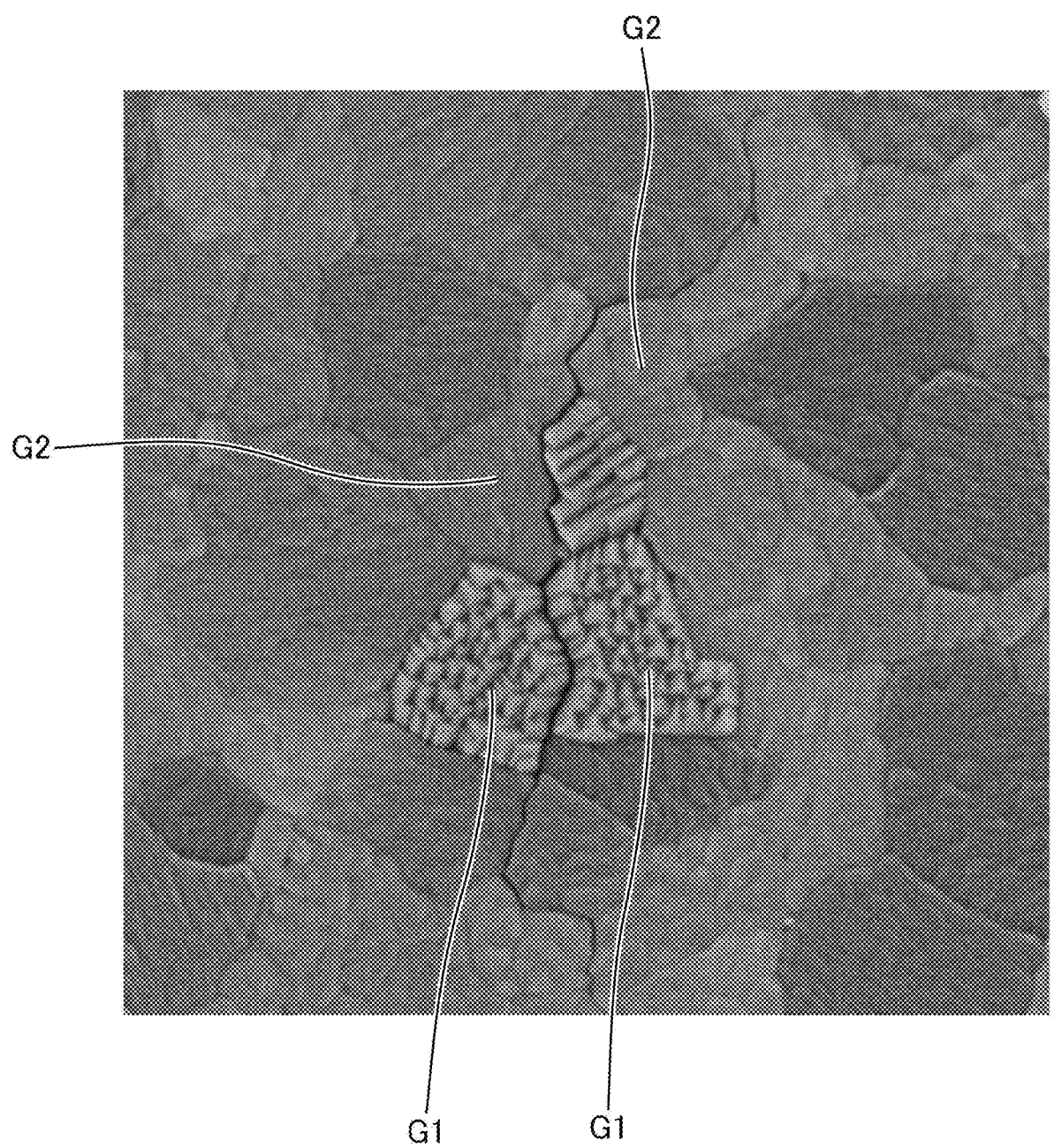
FIG. 21 is an SEM image of Example 1.

FIG. 21 is an SEM image of a site where cracking occurred in Example 1. As shown in FIG. 21, it was found that cracking in a KNNM layer starts at the grain boundary between neighboring first grains G1 and propagates therefrom to the grain boundary of the second grains G2. Accordingly, when an area occupied by the faces of the first grains G1 increases, the probability increases that the first grains G1 adjoin each other. As a result, the probability of the occurrence of cracking increases.

From the above results, it was found that when an area occupied by the faces of the first grains G1 is 10.0% or less, the probability decreases that the first grains G1 adjoin each other on the upper surface of the piezoelectric layer, thereby suppressing the occurrence of cracking. Moreover, as shown in FIG. 20, it was also found that an area occupied by the faces of the first grains G1 of 10.0% or less can be achieved by controlling the thickness of the first KNNM layer to preferably 75 nm or less and the thickness of each second KNNM layer to preferably 51 nm or less.

To observe the surface shapes for Comparative Examples 2 and 3, SEM observation was performed, for a sample tilted by 45°, by using "S-4700" from Hitachi High-Tech Fielding Corporation under conditions of an accelerating voltage of 10 kV, an imaging magnification of 30,000×, and an SE (U) detector.

Figure 22:
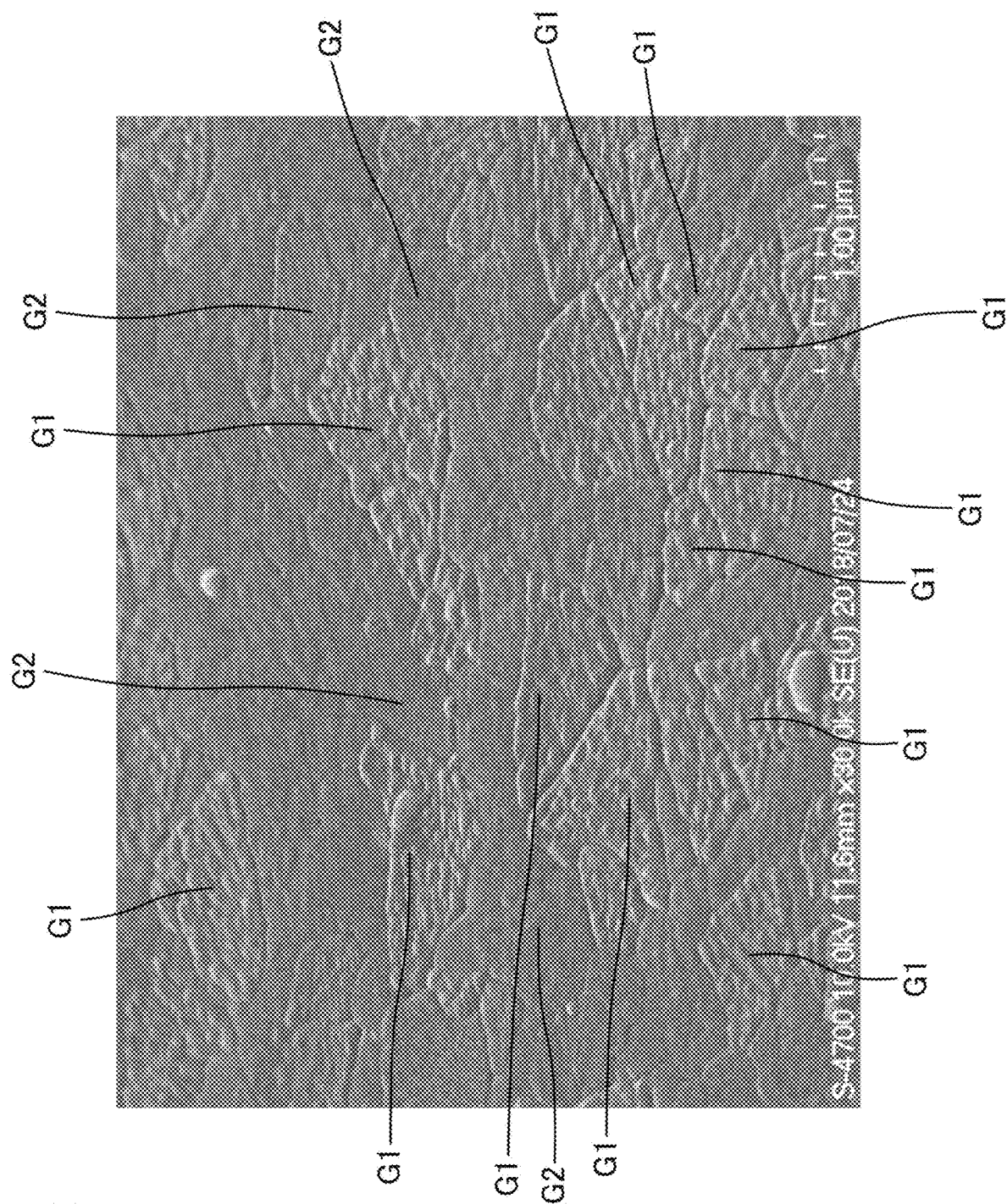
FIG. 22 is an SEM image of Comparative Example 2.

FIG. 22 is an SEM image of Comparative Example 2. As shown in FIG. 22, the first grains G1 and the second grains G2 were revealed to exist as in Examples 1 and 2 and Comparative Example 1. An area occupied by the faces of the first grains G1 was also calculated by a method similar to that for Examples 1 and 2 and Comparative Example 1. The result is shown in FIG. 20.

Figure 23:
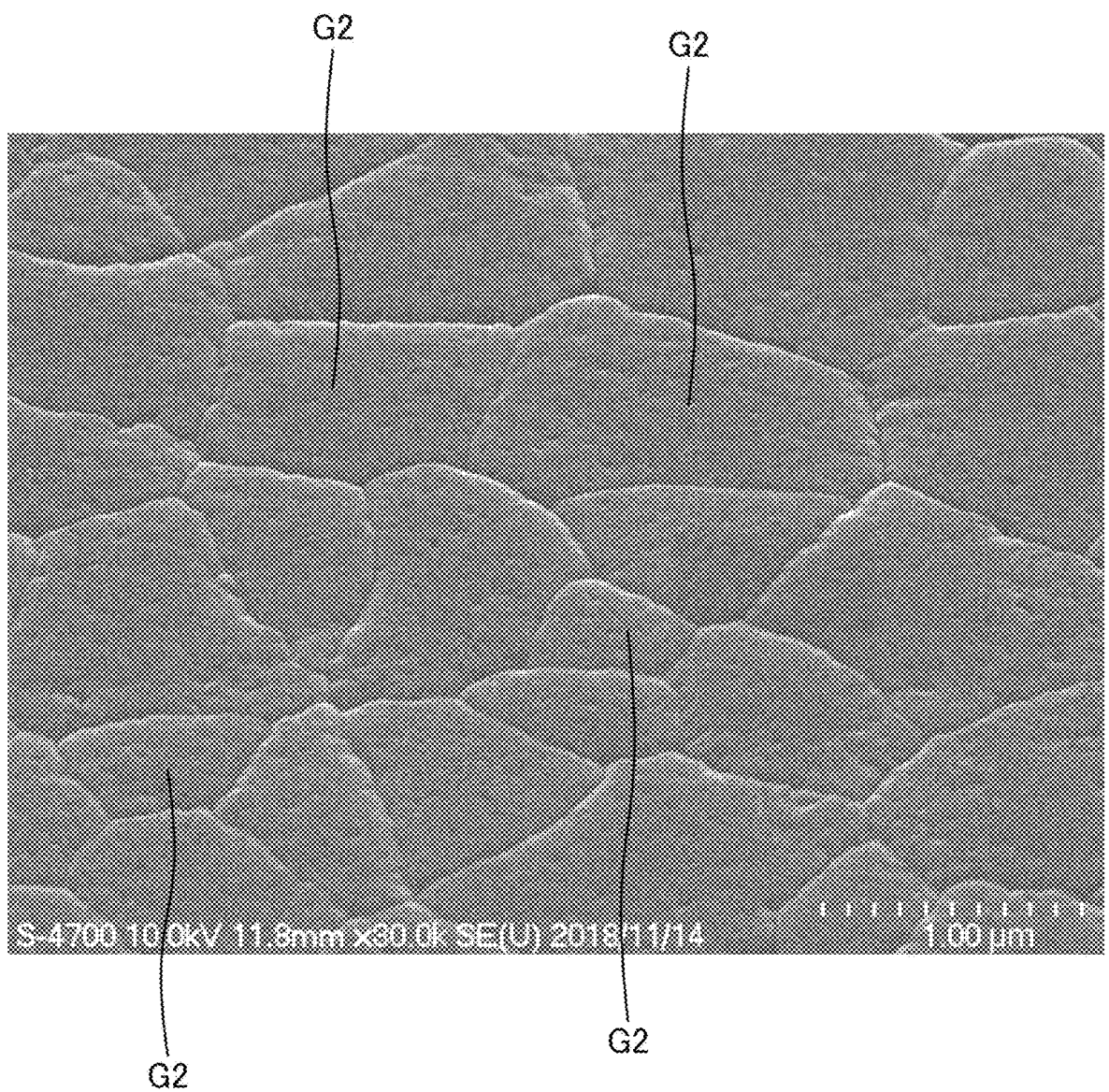
FIG. 23 is an SEM image of Comparative Example 3.

FIG. 23 is an SEM image of Comparative Example 3. As shown in FIG. 23, only the second grains G2 were observed for the BLFMT layer, despite being (111)-oriented as in the foregoing, without observing the first grains G1 as in Examples 1 and 2 and Comparative Examples 1 and 2. This revealed that the first grains G1 are not a phenomenon widely observed for (111)-oriented $ABO_3$-type perovskite oxides, but rather a phenomenon characteristically observed for the ABO$_3$-type perovskite oxide primarily containing potassium, sodium, and niobium.

5.5. SEM-EBSD Observation

By using "JSM-7800F" from JEOL Ltd. and "AZtec HKL Advanced Nordlys Nano" from Oxford Instruments plc, SEM observation and electron back-scattering diffraction (EBSD) evaluation were performed.

Figure 24:
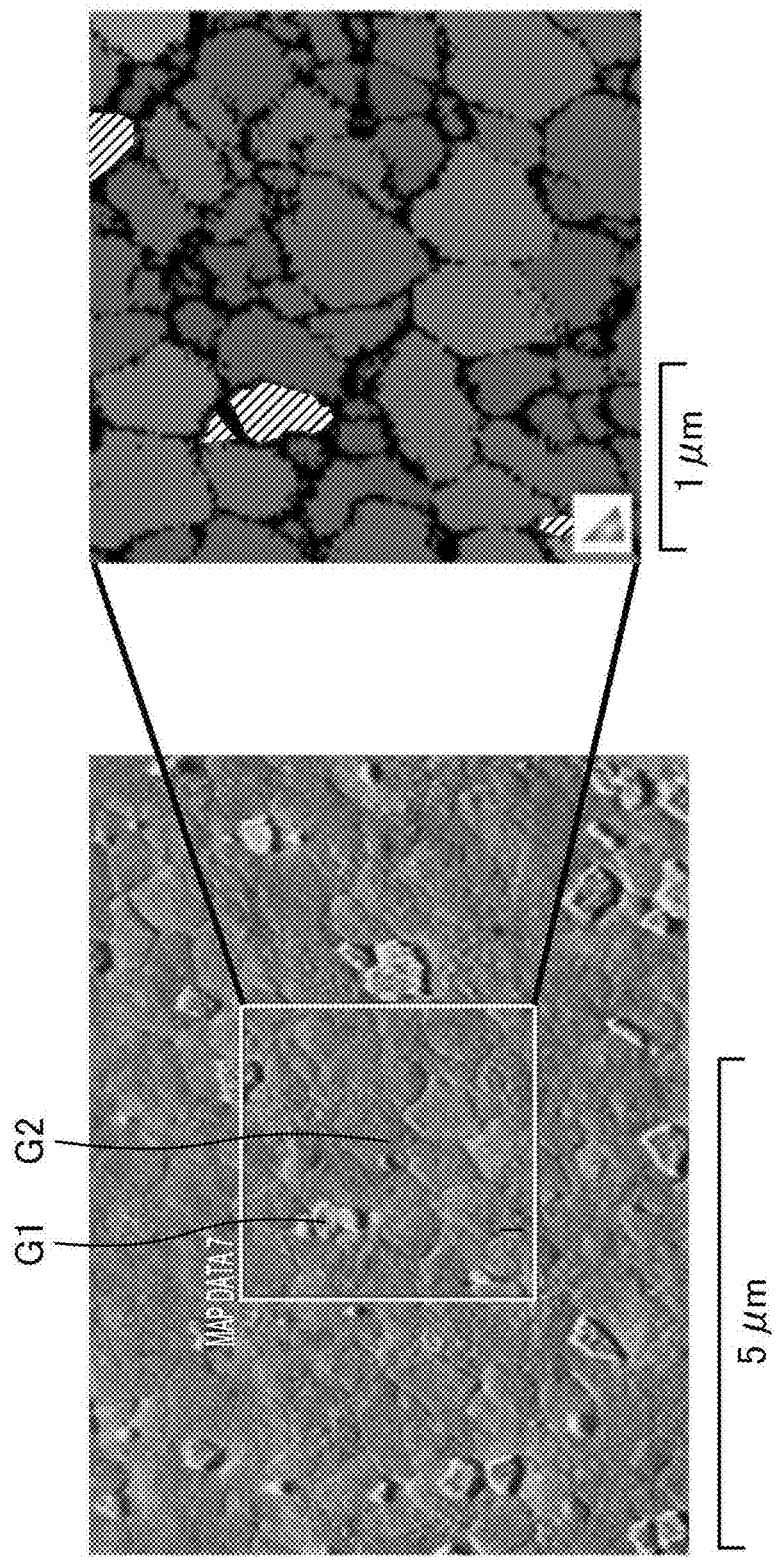
FIG. 24 is an SEM image and an EBSD map of Example 1.

FIG. 24 is an SEM image and an EBSD map of Example 1. As shown in FIG. 24, in comparison between the SEM image and the EBSD map, only the first grains G1 of the SEM image are mapped as (111) in the EBSD image. This revealed that a difference in grain shape on an SEM image indicates a difference in orientation of the KNNM layer, and hence the second grains G2 are (100)-oriented whereas the first grains G1 are (111)-oriented.

Here, for convenience, the first grains mapped as (111) are hatched in the map of FIG. 24.

5.6. STEM Observation

To evaluate a roughness on the surface of the first grains in Example 1, STEM observation was performed for a cross-section thinned by focused ion beams (FIB). For evaluation, "HD 2000" from Hitachi, Ltd. was used.

Figure 25:
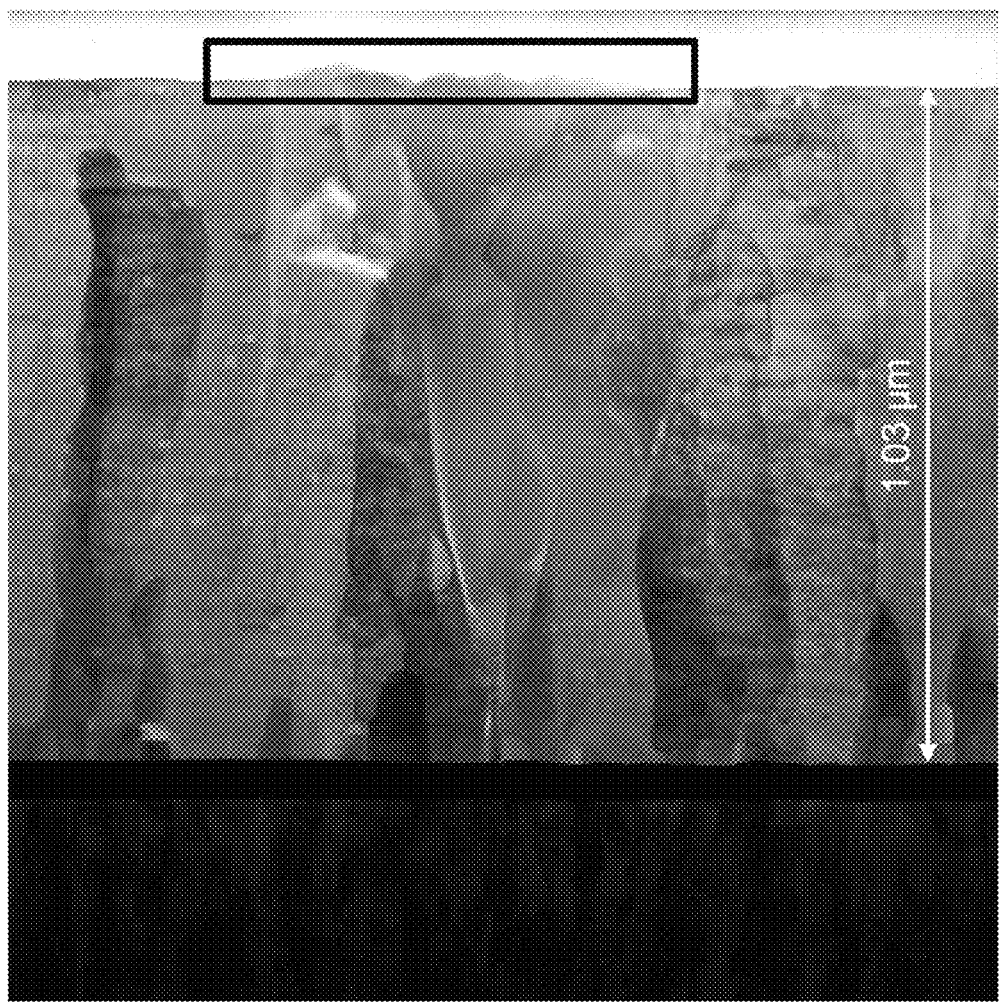
FIG. 25 is an STEM image of Example 1.

FIG. 25 is an STEM micrograph of the cross-section of Example 1. As shown in FIG. 25, the surface of the first grain was found to be a concave-convex shape. As a result of measuring lengths by using the STEM micrograph, the heights of six protrusions of the first grain are each 24 nm, 24 nm, 28 nm, 22 nm, 18 nm, and 13 nm; the average height is 21 nm; and the standard deviation is 5.1. For convenience, the surface of the first grain is enclosed with a solid line in FIG. 25. Moreover, the size of the roughness on the surface of the second grains was less than 5 nm, which is smaller than the size of the roughness on the surface of the first grains.

The present disclosure is not limited to the above-described embodiments and various modifications are further possible. For example, the present disclosure encompasses the constitution substantially the same as the constitution described as the embodiments. The substantially same constitution is the constitution with the same function, method, and results or the constitution with the same object and effects, for example. In addition, the present disclosure encompasses the constitution that is described as the embodiment but is replaced in the nonessential portion. Moreover, the present disclosure encompasses the constitution that exerts the same advantageous effects as the constitution described as the embodiment or the constitution that can attain the same object as the constitution described as the embodiment. Further, the present disclosure encompasses the constitution in which the constitution described as the embodiment is added with a publicly-known technique.

What is claimed is:

1. A piezoelectric element comprising:
a first electrode provided on a base;
a second electrode; and
a piezoelectric layer that is provided between the first electrode and the second electrode and that contains a complex oxide having a perovskite structure and including potassium, sodium, and niobium, wherein:
a surface of the piezoelectric layer on a side of the second electrode is composed of faces of first grains and faces of second grains;
a roughness height on the faces of the first grains is larger than a roughness height on the faces of the second grains;
an area occupied by the faces of the first grains is 10.0% or less on the surface of the piezoelectric layer; and
the area occupied by the faces of the first grains corresponds to a ratio of a total area of the faces of the first grains on the surface of the piezoelectric layer to an area of the surface of the piezoelectric layer.

2. The piezoelectric element according to claim 1, wherein when a crystal structure of the piezoelectric layer is regarded as pseudo-cubic, the piezoelectric layer has (100) preferred orientation.

3. The piezoelectric element according to claim 2, wherein when the crystal structure of the piezoelectric layer is regarded as pseudo-cubic,
the first grains are (111)-oriented; and
the second grains are (100)-oriented.

4. A piezoelectric element comprising:
a first electrode provided on a base;
a second electrode; and
a piezoelectric layer that is provided between the first electrode and the second electrode and that contains a complex oxide having a perovskite structure and including potassium, sodium, and niobium, wherein:
when a crystal structure of the piezoelectric layer is regarded as pseudo-cubic, the piezoelectric layer includes (111)-oriented grains;
an area occupied by faces of the grains is 10.0% or less on a surface of the piezoelectric layer on a side of the second electrode; and
the area occupied by the faces of the grains corresponds to a ratio of a total area of the faces of the grains on the surface of the piezoelectric layer to an area of the surface of the piezoelectric layer.

5. The piezoelectric element according to claim 1, wherein a thickness of the piezoelectric layer is 500 nm or more and 2 µm or less.

6. The piezoelectric element according to claim 1, wherein:
the piezoelectric layer is formed by stacking a first layer and a plurality of second layers;
the first layer is provided between the first electrode and the plurality of second layers;
a ratio of potassium to sodium atom concentrations in the first layer is different from a ratio of potassium to sodium atom concentrations in each of the plurality of second layers; and
a thickness of each of the plurality of second layers is 51 nm or less.

7. The piezoelectric element according to claim 6, wherein a thickness of the first layer is 75 nm or less.

8. A liquid discharge head comprising:
the piezoelectric element according to claim 1; and
a nozzle plate provided with a nozzle hole for discharging a liquid, wherein:
the base includes a channel-formed substrate provided with a pressure chamber that changes a volume by the piezoelectric element and a supply channel for supplying the liquid to the pressure chamber; and
the nozzle hole is connected with the pressure chamber.

9. A printer comprising:
the liquid discharge head according to claim 8;
a transport mechanism for moving a recording medium relative to the liquid discharge head; and a control unit for controlling the liquid discharge head and the transport mechanism.

* * * * *